(12) United States Patent
Strachan et al.

(10) Patent No.: US 9,842,647 B1
(45) Date of Patent: Dec. 12, 2017

(54) PROGRAMMING OF RESISTIVE RANDOM ACCESS MEMORY FOR ANALOG COMPUTATION

(71) Applicant: HEWLETT PACKARD ENTERPRISE DEVELOPMENT LP, Houston, TX (US)

(72) Inventors: John Paul Strachan, San Carlos, CA (US); Brent Buchanan, Fort Collins, CO (US); Emmanuelle Merced Grafals, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/267,124

(22) Filed: Sep. 15, 2016

(51) Int. Cl.
*G11C 11/00* (2006.01)
*G11C 13/00* (2006.01)
*G11C 29/52* (2006.01)

(52) U.S. Cl.
CPC .......... *G11C 13/0069* (2013.01); *G11C 29/52* (2013.01)

(58) Field of Classification Search
CPC . G11C 13/0002; G11C 2213/71; G11C 5/025; G11C 13/0026; G11C 13/0028; G11C 2213/77; G11C 13/0007; G11C 13/0011; G11C 5/06; G11C 13/0004; G11C 2213/50; G11C 2213/72; G11C 13/004; G11C 13/0069
USPC .................... 365/51, 130, 174, 180, 135, 63
See application file for complete search history.

(56) References Cited

U.S. PATENT DOCUMENTS

2016/0005461 A1\* 1/2016 Jo ........................ G11C 29/026
365/148

\* cited by examiner

*Primary Examiner* — Thong Q Le
(74) *Attorney, Agent, or Firm* — Hewlett Packard Enterprise Patent Department

(57) ABSTRACT

Examples include a method of programming resistive random access memory (RRAM) array for analog computations. In some examples, a selected RRAM cell of the RRAM array may be programmed with a selected target conductance and a programmed conductance error of the selected RRAM cell may be determined. A neighboring RRAM cell may be programmed with an error corrected target conductance that is a function of a neighboring target conductance and the programmed conductance error of the selected RRAM cell. The neighboring RRAM cell may be in a same row or a same column as the selected RRAM cell. The selected RRAM cell and neighboring RRAM cell are programmed such that the RRAM array is programmed for an analog computation.

20 Claims, 10 Drawing Sheets

PROGRAMMING OF RESISTIVE RANDOM ACCESS MEMORY FOR ANALOG COMPUTATION

STATEMENT OF GOVERMENT RIGHTS

This invention was made with Government support. The Goverment has certain rights in the invention.

BACKGROUND

A resistive random access memory (RRAM) array may be used for analog computations. Cells of the RRAM array are programmed to have a specific conductance such that a dot product of cells applies to an analog computation. In some instances, the programming of a cell may result in the programmed conductance of the cell differing from the target conductance of the cell.

BRIEF DESCRIPTION OF THE DRAWINGS

The following detailed description references the drawings, wherein.

DETAILED DESCRIPTION

Figure 1A:
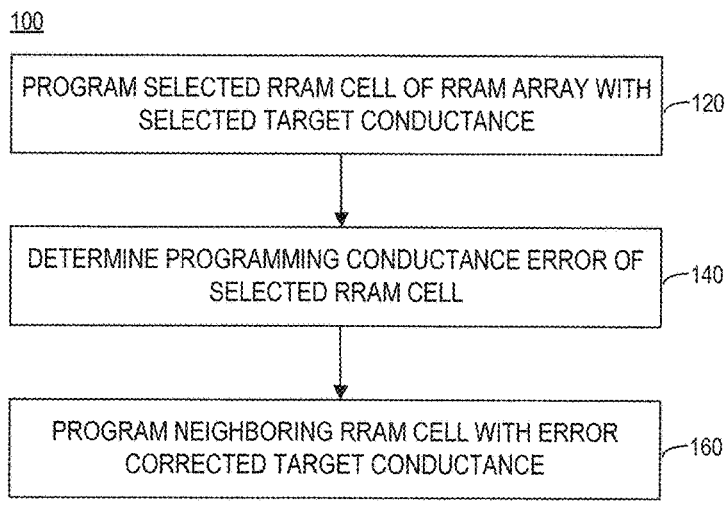
FIG. 1A is a flowchart of an example method of programming a resistive random access memory (RRAM) array for analog computation including programming a selected RRAM cell with a selected target conductance and programming a neighboring RRAM cell with an error corrected target conductance.

A resistive random access memory (RRAM) array may be programmed for analog computation. The analog computation may involve certain cells of the RRAM array having differing conductance such that the particular analog computation is accurate. Programming RRAM cells to have a specific conductance often results in a programmed conductance error. In some examples, the programmed conductance may be higher than expected. Whereas in other examples, the programmed conductance may be lower than expected. Such errors may affect the overall computational accuracy of the analog computation for which the RRAM array is programmed.

A closed-loop programming scheme may be used to reduce programming error. Under such a scheme, a cell may be iteratively programmed and reprogrammed, alternatively over-shooting and then under-shooting the target conductance until the cell is within a target threshold of the target conductance. Such a scheme may involve numerous programming cycles, may be prohibitively time-consuming, and may fail to result in a suitably accurate computation.

Examples described herein may allow for an inaccurate target conductance at a selected RRAM cell by adjusting a neighboring RRAM cell's target conductance to account for the conductance error at the selected RRAM cell. For instance, examples described herein may involve programming a selected RRAM cell, determining the programmed conductance error of the selected RRAM cell, and programming a neighboring RRAM cell with an error corrected target conductance that is a function of a neighboring target conductance and the programmed conductance error of the selected RRAM cell. In some such examples, the neighboring RRAM cell may be reduced by a factor of the programmed conductance error of the selected RRAM cell to compute the error corrected target conductance.

In some examples described herein, a method of programming an RRAM array for an analog computation may include programming a selected RRAM cell of the RRAM array with a selected target conductance and determining a programmed conductance error of the selected RRAM cell. The method may further include programming a neighboring RRAM cell with an error corrected target conductance. The neighboring RRAM cell may be in the same row as the selected RRAM cell or a same column as the selected RRAM cell and the error corrected target conductance may be a function of a neighboring target conductance and the programmed conductance error of the selected RRAM cell. Both the selected RRAM cell and the neighboring RRAM cell are programmed such that the RRAM array is programmed for the analog computation.

In some such examples, programming the neighboring RRAM cell comprises programming a first neighboring RRAM cell with a first error corrected target conductance that is a function of a first target conductance and the programmed conductance error of the selected RRAM cell and programming a second neighboring RRAM cell with a second error corrected target conductance that is a function of a second target conductance and the programmed conductance error of the selected RRAM cell. In some examples, programming the neighboring RRAM cell may further comprise programming a third neighboring RRAM cell with a third error corrected target conductance that is a function of a third target conductance and the programmed conductance error of the selected RRAM cell and programming a fourth neighboring RRAM cell with a fourth error corrected target conductance that is a function of a fourth target conductance and the programmed conductance error of the selected RRAM cell. In other examples, programming the neighboring RRAM cell may instead further comprise programming the third neighboring RRAM cell with a third error corrected target conductance that is a function of a third target conductance and the programmed conductance error of the first neighboring RRAM cell and programming a fourth neighboring RRAM cell with a fourth error corrected target conductance that is a function of a fourth target conductance and the programmed conductance error of the second neighboring RRAM cell.

In some examples described herein, an RRAM array programmed for an analog computation may comprise a selected RRAM cell of the RRAM array that is programmed with a selected target conductance. The RRAM array may also comprise a first neighboring RRAM cell that is programmed with a first error corrected target conductance, which is a function of a first target conductance and a programmed conductance error of the selected RRAM cell. The RRAM array may further comprise a second neighboring RRAM cell that is programmed with a second error corrected target conductance, which is a function of a second target conductance and the programmed conductance error of the selected RRAM cell. The selected RRAM cell, the first neighboring RRAM cell, and the second neighboring RRAM cell may be programmed such that the RRAM array is programmed for the analog computation.

In some examples described herein, a non-transitory machine-readable storage medium comprises instructions executable by a processing resource to program an RRAM array for analog computation. The instructions may program a selected RRAM cell of the RRAM array with a selected target conductance, determine a programmed conductance error of the selected RRAM cell, and program a neighboring RRAM cell with an error corrected target conductance. The error corrected target conductance is a function of a neighboring target conductance and the programmed conductance error of the selected RRAM cell.

Programming the selected RRAM cell and the neighboring RRAM cell programs the RRAM array for the analog computation, which may be a linear transformation, a convolution operation, or a neural network inference algorithm. In examples described herein, a determination, action, etc., that is said to be a function of a given condition may be a function of that condition alone or a function of that condition and other condition(s).

Referring now to the drawings, FIG. 1 is a flowchart of an example method 100 of programming a resistive random access memory (RRAM) array for analog computation. As used herein, RRAM may be a non-volatile random access memory in which state is determined by measuring resistance. In some examples, RRAM may involve changing resistance across a dielectric solid state material. For example, any RRAM described herein may be any of memristor, phase change memory, conductive-bridging random access memory (CBRAM), spin-transfer torque random access memory, and the like. An RRAM array, as used herein, may be an arrangement of RRAM cells in rows and columns. An RRAM cell may exist at each intersection of a row and a column of the RRAM array.

Method 100 may program the RRAM array for analog computations. The analog computations may include linear transformations (e.g., Fourier transform, discrete cosine transform, etc.), convolution operations (e.g., periodic convolutions, discrete convolutions, etc.), neural network inference algorithms (e.g., backpropagation algorithms, machine learning algorithms, etc.), and the like. The performance of different analog computations, may involve different RRAM cells of the RRAM array having varying conductance. Conductance refers to the degree to which an object conducts electricity. Depending on the analog computation to be performed, each RRAM cell within an RRAM array may have a particular target conductance, which may vary from one RRAM cell to the next. The target conductance of an RRAM cell, as used herein, refers to an intended or an ideal conductance for the RRAM cell. The target conductance for an RRAM cell is the conductance the RRAM cell would have if programming were error-free.

Figure 4:
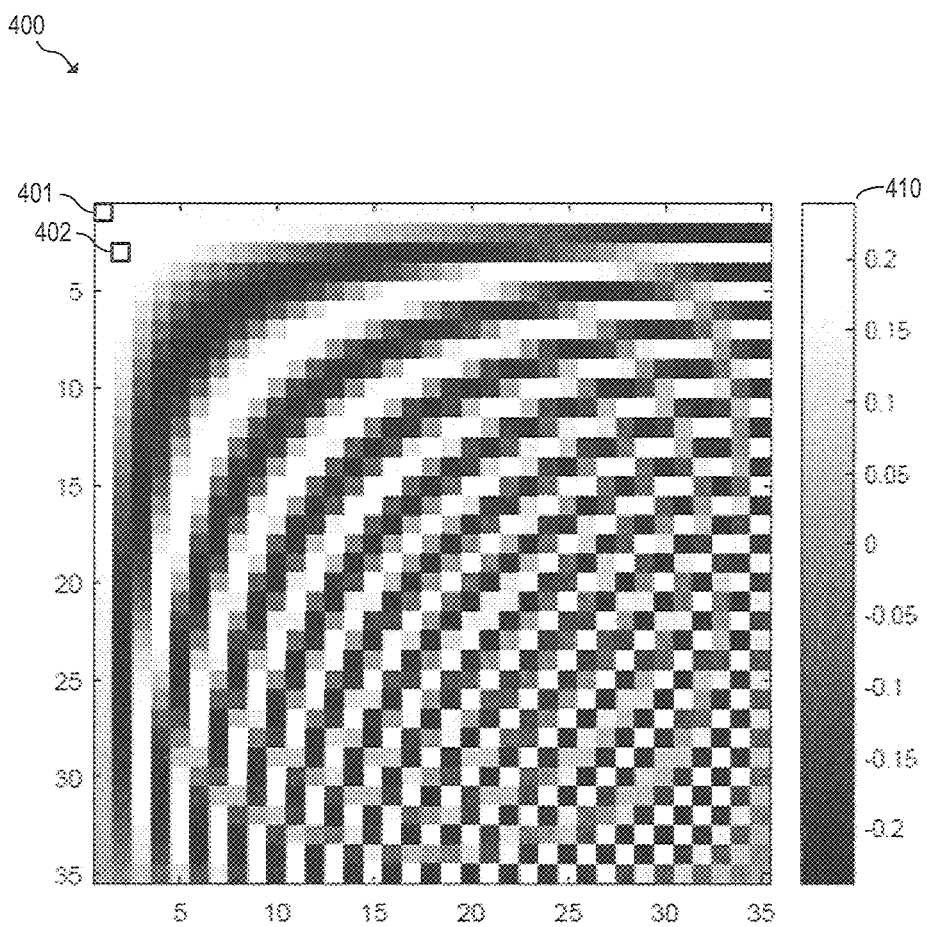
FIG. 4 is a conductance plot of a target conductance of an example RRAM array that is programmed for a Discrete Cosine Transform.

Turning to FIG. 4, an example conductance plot of an RRAM array 400 is shown. As shown, the x-axis depicts a number of columns of RRAM array 400 and the y-axis depicts a number of rows of RRAM array 400. Although 35 columns and 35 rows are shown in the example of FIG. 4, any suitable number of rows and columns may be used. An RRAM cell may exist at an intersection of each column and row of RRAM array 400, as shown by example RRAM cells row 401 and 402. As shown, RRAM cell 401 is located at the intersection of a first row and first column of RRAM array 400 and RRAM cell 402 is located at the intersection of a third row and second column of RRAM array 400. Conductance key 410 depicts that darker shades of gray indicate a lower conductance while lighter shades of gray indicate a higher conductance, with shades in between indicating a corresponding conductance. In the example of FIG. 4, each RRAM cell of RRAM array 400 has a target conductance, as shown, such that RRAM array 400 may be used to perform a Discrete Cosine Transform. As can be seen, different RRAM cells of RRAM array 400 may have different target conductance.

Returning to method 100 of FIG. 1A, at 120, a selected RRAM cell of the RRAM array is programmed with a selected target conductance. As used herein, an RRAM cell may refer to a non-linear, passive, two-terminal electrical device within an RRAM array that has or exhibits a conductance level or state that is a function of bias history. A bias refers to a voltage, a current, or a combination of a voltage and current applied across terminals of the RRAM cell and may be used to set, select, or program a conductance of the RRAM cell. The RRAM cell may comprise a switching medium that exhibits a switching phenomenon or characteristic when subjected to a stimulus such as a voltage or a current. The switching medium is placed between two metallic filaments or electrodes having different polarities. The electrodes facilitate the application of a stimulus or a programming signal to affect a change in the switching material of the RRAM cell. The application of a particular voltage, current, or combination of voltage and current across the terminals of an RRAM cell may establish a programmed conductance of the RRAM cell.

An RRAM cell may provide storage of the programmed conductance. In particular, the programmed conductance may be stored in a non-volatile manner by the RRAM cell until the RRAM cell is once again programmed (i.e., reprogrammed) to establish a second programmed conductance. When not being programmed, the RRAM cell may substantially retain the programming resistance even in the absence of power.

The selected RRAM cell, as used herein, is an RRAM cell of an RRAM array that is to be programmed with a selected target conductance. The selected target conductance, as used herein, is a target conductance of the selected RRAM cell. In the example of FIG. 1A, the selected RRAM cell may be any cell of the RRAM array. In some examples, the selected RRAM cell of the RRAM array is an nth RRAM cell, where n is a nearest integer of N/2. In such an example N represents a number of cells in a column or row of the RRAM array and is a positive integer greater than 1. For example, in an RRAM array having 40 cells in a column, the selected RRAM cell may be the 20th (40/2) RRAM cell in the column. Likewise, in an RRAM array having 35 cells in a row, the selected RRAM cell may be the 17th or the 18th (35/2) RRAM cell in the row. In other examples, as appropriate, the selected RRAM cell may also be a first cell in a row or column, a last cell in a row or column, or any cell in between.

At 120, a particular voltage, current, or combination thereof may be applied across the terminals of the selected RRAM cell to program the selected RRAM cell with a selected target conductance. Depending on the selected target conductance, the applied voltage, current, or combination thereof may be correspondingly higher or lower in order to program the selected RRAM cell to have the selected target conductance.

At 140, the programmed conductance error of the selected RRAM cell is determined. The programmed conductance error may be determined by measuring the actual programmed conductance of the selected RRAM cell (i.e., the programmed conductance of the selected RRAM cell) reduced by the selected target conductance. In some examples, the programmed conductance may be measured by applying a low voltage or current that will not disturb the conductance, but allows the state to be read. If the programmed conductance of the selected RRAM cell is greater than the selected target conductance, the programmed conductance error is represented by a positive number. If the programmed conductance of the selected RRAM cell is less than the selected target conductance, the programmed conductance error is represented by a negative number.

In some examples, steps 120 and 140 may be repeated until the programmed conductance of the selected RRAM is within a certain error threshold of the target conductance of the selected RRAM. For instance, steps 120 and 140 may iterate until the programmed conductance of the selected RRAM cell is within 20% (or some other suitable percentage or amount) of the target conductance of the selected RRAM cell. In other examples, method 100 may simply proceed to 160, regardless of the percentage or amount by which the programmed conductance varies from the target conductance of the selected RRAM cell.

At 160 of method 100, a neighboring RRAM cell may be programmed with an error corrected target conductance. A neighboring RRAM cell, as used herein, may refer to a cell that is adjacent to or proximate to the selected RRAM cell. In the example of FIG. 1A, the neighboring RRAM cell refers to an RRAM cell in the same row or the same column as the selected RRAM cell. In one example, the selected RRAM cell may be an RRAM cell at the intersection of a second row and a third column in an RRAM array (e.g., $RC_{2,3}$ of FIG. 2). In such an example, the neighboring RRAM cell in a same row as the selected RRAM cell may be the RRAM cell at the second column (e.g., $RC_{2,2}$ of FIG. 2) and/or the RRAM cell at the fourth column (e.g., $RC_{2,4}$ of FIG. 2). The neighboring RRAM cell in a same column as the selected RRAM cell may be the RRAM cell at the first row (e.g., $RC_{1,3}$ of FIG. 2) and/or the RRAM cell at the third row (e.g., $RC_{3,3}$ of FIG. 2).

In another example, the neighboring RRAM cell may include the next two (or three or more) closest RRAM cells in a same row or column as the selected RRAM cell such that each of the target conductance of these cells are adjusted by the programmed conductance error of the selected RRAM cell. For instance, if the selected RRAM cell is at a second row and a third column of the RRAM array (e.g., $RC_{2,3}$ of FIG. 2), the neighboring RRAM cell may include the selected RRAM cells in the same row and the first column (e.g., $RC_{2,1}$ of FIG. 2), the second column (e.g., $RC_{2,2}$ of FIG. 2), the fourth column (e.g., $RC_{2,4}$ of FIG. 2), and the fifth column (e.g., $RC_{2,5}$ of FIG. 2, not shown).

The error corrected target conductance, as used in the examples herein, is an adjusted target conductance of the neighboring RRAM cell that accounts for programmed conductance error of another RRAM cell in the RRAM array. In the example of FIG. 1A, the error corrected target conductance is a function of a neighboring target conductance and the programmed conductance error of the selected RRAM cell. The neighboring target conductance is the target conductance of the neighboring RRAM cell and is an intended or an ideal conductance for the neighboring RRAM cell. As used here, the neighboring target conductance is the ideal conductance of the neighboring RRAM cell for the RRAM array to perform the analog computation. The neighboring target conductance for the neighboring RRAM cell is the conductance the neighboring RRAM cell would have if programming were error-free.

The error corrected target conductance of the neighboring RRAM cell may be the neighboring target conductance adjusted by some, all, none, or an amount greater than the programmed conductance error of the selected RRAM cell. In the example of FIG. 1A, the programmed conductance error of the selected RRAM cell may be distributed or spread to neighboring RRAM cells in either a same column or a same row as the selected RRAM cell. In some examples, the error corrected target conductance of the neighboring RRAM cell can adjust for a programmed conductance error of other additional RRAM cells besides the selected RRAM cell.

At 160, a particular voltage, current, or combination thereof may be applied across the terminals of the neighboring RRAM cell to program the neighboring RRAM cell with the error corrected target conductance. Depending on the error corrected target conductance, the applied voltage, current, or combination thereof may be correspondingly higher or lower in order to program the neighboring RRAM cell to have the error corrected target conductance. In the example of FIG. 1A, the programmed conductance error of the selected RRAM cell may be distributed or spread to neighboring RRAM cells in either a same column or a same row as the selected RRAM cell. The programming of the selected RRAM cell and the neighboring RRAM cell support the programming of the RRAM array for the analog computation.

In some examples, determining a programmed conductance error and programming RRAM cells may be done via a non-transitory machine-readable storage medium comprising instructions executable by a processing resource, as described below in relation to FIGS. 3A-3D. In other examples, determining a programmed conductance error and programming RRAM cells may be done via an application specific integrated circuit (ASIC) or hard-coded logic.

In some examples, a programmed conductance error of the neighboring RRAM cell may be calculated to determine the difference between the actual programmed conductance of the neighboring RRAM cell and the error corrected target conductance of the RRAM cell. An adjacent RRAM cell to the neighboring RRAM cell may be programmed with an error corrected target conductance that is a function of the adjacent RRAM cell's target conductance and the programmed conductance error of the neighboring RRAM cell. In this manner, each RRAM cell in either the same column or the same row as the selected RRAM cell may be programmed. At the boundary of the RRAM array, any remaining programmed conductance error may simply be discarded or may also be used to determine an error corrected target conductance of an RRAM cell in a next row or column in the RRAM array.

Figure 5:
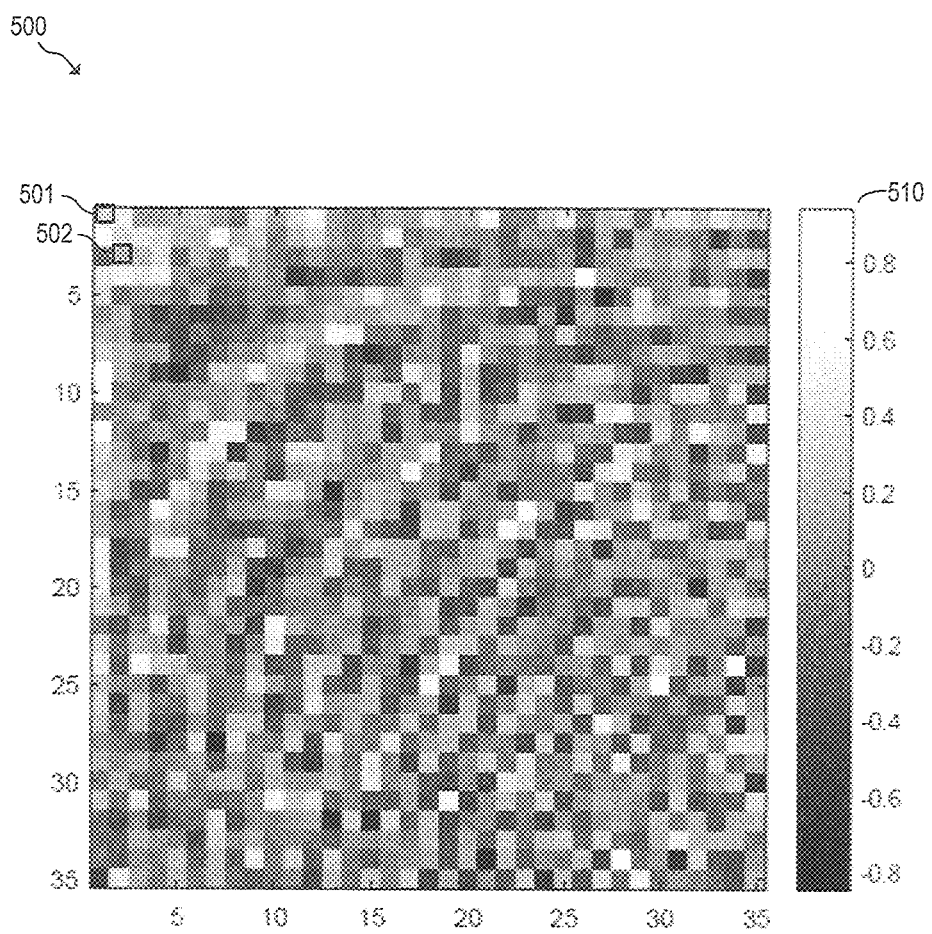
FIG. 5 is a conductance plot of a programmed conductance of an example RRAM array that is programmed for a Discrete Cosine Transform using the examples described herein.

FIG. 5 depicts an example conductance plot of an RRAM array 500 in which the cells were programmed using method 100. Like RRAM array 400 of FIG. 4, the x-axis depicts a number of columns of RRAM array 500 and the y-axis depicts a number of rows of RRAM array 500. Although 35 columns and 35 rows are shown in the example of FIG. 5, any suitable number of rows and columns may be used. An RRAM cell may exist at an intersection of each column and row of RRAM array 500, as shown by the example RRAM cells 501 and 502. Like RRAM cells 401 and 402 of FIG. 4, RRAM cell 501 is located at a first row and first column of RRAM array 500 and RRAM cell 502 is located at a third row and second column of RRAM array 500. Conductance key 510 depicts that darker shades of gray indicate a lower conductance while lighter shades of gray indicate a higher conductance, with shades in between indicating a corresponding conductance.

In the example of FIG. 5, each cell of RRAM array 500 has a target conductance that is the same as the corresponding cell in RRAM array 400 of FIG. 4. The RRAM cells of RRAM array 500, however, were programmed using method 100. Thus, a selected RRAM cell of RRAM array 500 was programmed with the selected target conductance (i.e., the target conductance associated with the selected RRAM cell) and a neighboring RRAM cell was programmed with an error corrected target conductance that is a function of the neighboring RRAM cell's target conductance and the programmed conductance error of the selected RRAM cell. Subsequent RRAM cells in a same row or column as the selected RRAM cell were likewise programmed with an error corrected target conductance that is a function of the subsequent RRAM cell's target conductance and the programmed conductance error of the prior RRAM cell until each cell of the RRAM array has been programmed. As shown in FIG. 5, As shown in FIG. 5, by not correcting for the programmed conductance error of the selected RRAM cell at the RRAM cell itself, method 100 may accept a larger degree of inaccuracy per RRAM cell. However, by adjusting a target conductance of neighboring RRAM cells by the programmed conductance error, method 100 may more efficiently program the RRAM array and improve computation accuracy across the RRAM array.

Although the flowchart of FIG. 1A shows a specific order of performance of certain functionalities, method 100 is not limited to that order. For example, the functionalities shown in succession in the flowchart may be performed in a different order, may be executed concurrently or with partial concurrence, or a combination thereof. In some examples, functionalities described herein in relation to FIG. 1A may be provided in combination with functionalities described herein in relation to any of FIGS. 2-5.

Figure 1B:
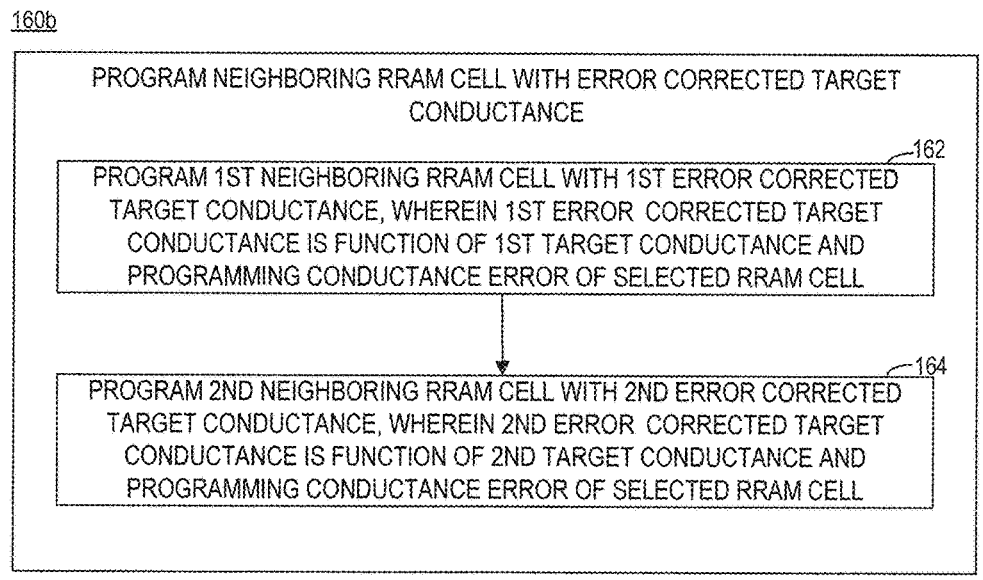
FIG. 1B is a flowchart of an example method of programming the neighboring RRAM cell including programming a first neighboring RRAM cell with a first error corrected target conductance and a second neighboring RRAM cell with a second error corrected target conductance.
Figure 1C:
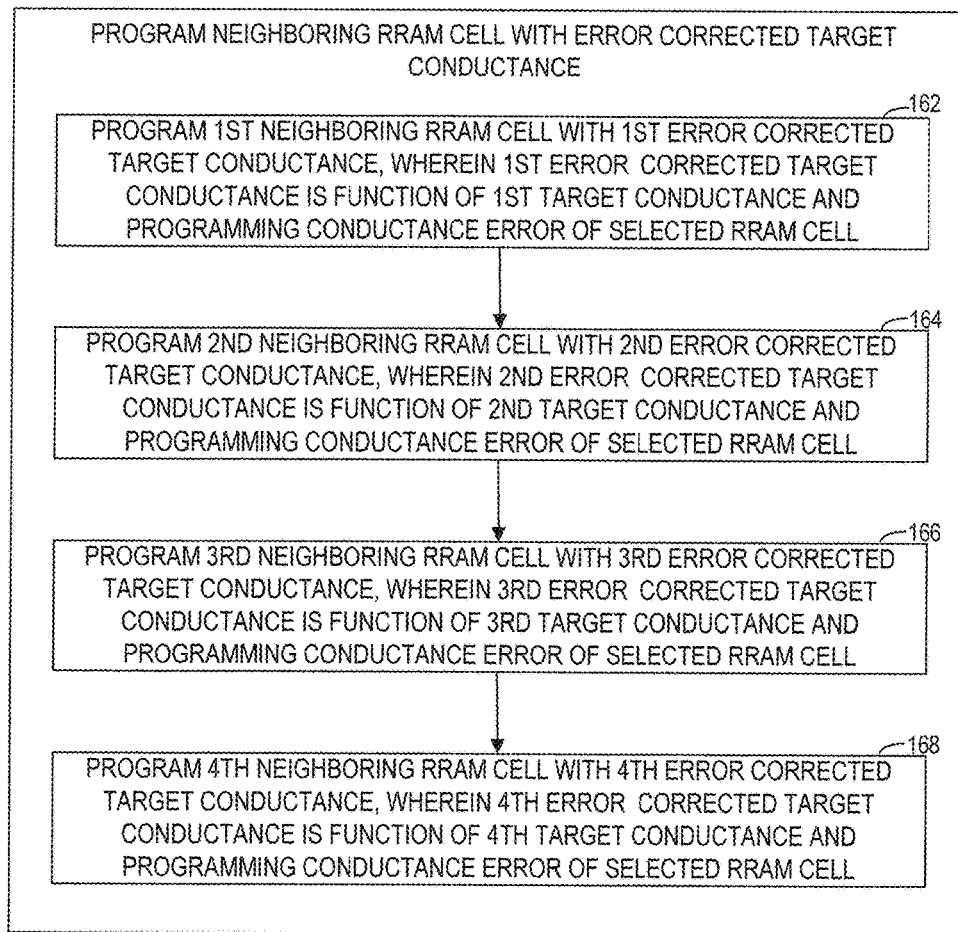
FIG. 1C is a flowchart of an example method of programming the neighboring RRAM cell including programming a first, second, third, and fourth neighboring RRAM cell with a first, second, third, and fourth error corrected target conductance, respectively, that are each a function of a programmed conductance error of the selected RRAM cell.
Figure 1D:
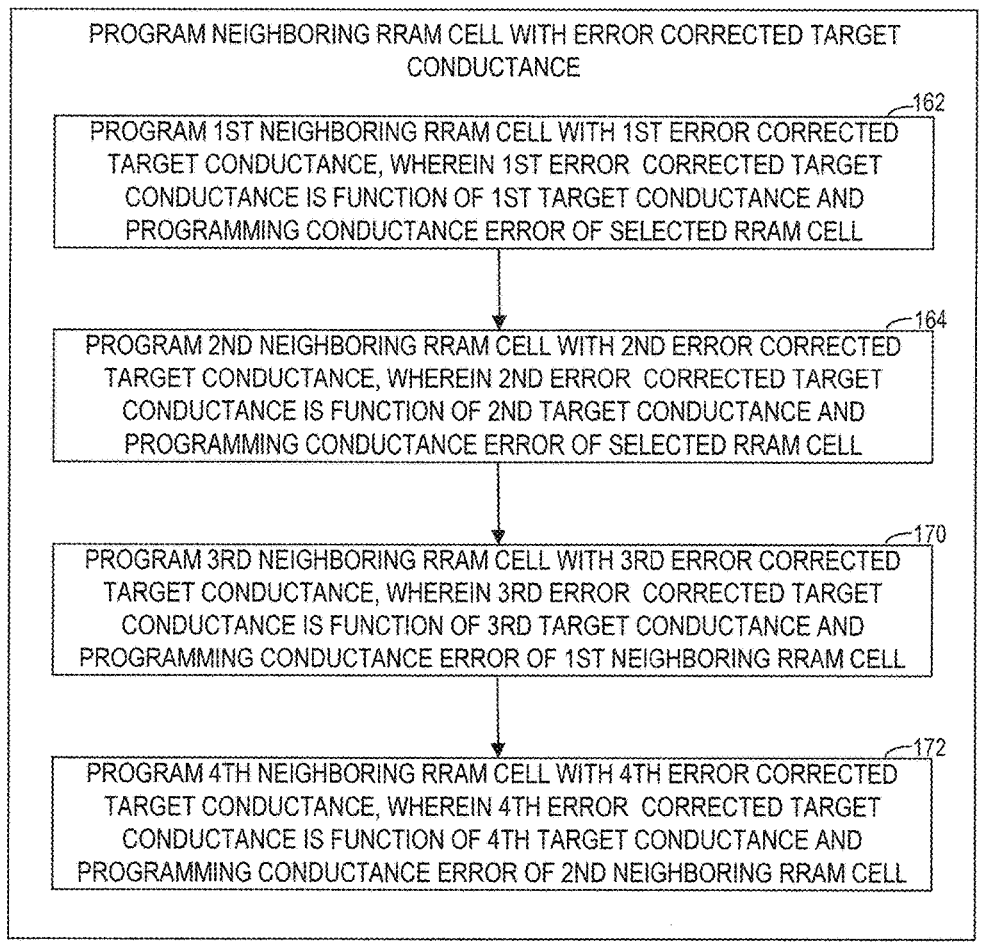
FIG. 1D is a flowchart of an example method of programming the neighboring RRAM cell including programming a first and second neighboring RRAM cell with a first and second error corrected target conductance, respectively, that are each a function of a programmed conductance error of the selected RRAM cell, and programming a third and fourth neighboring RRAM cell with a third and fourth error corrected target conductance, that are a function of a first and second neighboring RRAM cell, respectively.

FIGS. 1B-1D depict further example methods of step 160 of method 100 of FIG. 1A, according to various examples. FIG. 1B is a flowchart of an example method 160b of programming a neighboring RRAM cell with error corrected target conductance, as described above in relation to step 160 of method 100 of FIG. 1A. As shown, method 160b may comprise steps 162 and 164. In the example of FIG. 1B, at 162, a first neighboring RRAM cell may be programmed with a first error corrected target conductance that is a function of a first target conductance and the programmed conductance error of the selected RRAM cell.

The first neighboring RRAM cell, in the example of FIG. 1B, may refer to a cell that is adjacent to the selected RRAM cell and in the same row or the same column as the selected RRAM cell. As an example, if the selected RRAM cell is an nth cell in a column or row of the RRAM array, the first neighboring RRAM cell may be represented as the "n+1" or "n−1" cell. In another example in which the selected RRAM cell is depicted by $RC_{2,3}$ of FIG. 2, the first neighboring RRAM cell may be one of $RC_{2,2}$, $RC_{2,4}$, $RC_{1,3}$, or $RC_{3,3}$ of FIG. 2.

As used herein, the first target conductance is the ideal conductance of the first neighboring RRAM cell for the RRAM array to perform the analog computation. The first target conductance for the first neighboring RRAM cell is the conductance the first neighboring RRAM cell would have if programming were error-free. The first error corrected target conductance of the first neighboring RRAM cell may be the first target conductance adjusted by some, all, or, in some examples, none of the programmed conductance error of the selected RRAM cell, as determined at step 140 of FIG. 1A. The first error corrected target conductance may also be a function of error associated with other RRAM cells, a constant error value, or the like.

In some examples, the first error corrected target conductance $G_{n+1}^{ET}$ is represented by $$G_{n+1}^{ET}=G_{n+1}^{T}-x\cdot\Delta_{n}^{E} \qquad (1)$$

where $G_{n+1}^{T}$ is the first target conductance of the first neighboring RRAM cell, $\Delta G_{n}^{E}$ is the programmed conductance error of the selected RRAM cell, and x is a first factor, wherein 0≤x≤1. In such examples, the first error corrected target conductance of the first neighboring RRAM cell is reduced by a first factor x of the programmed conductance error of the selected RRAM cell where x is a positive fraction equal to or between 0 and 1.

If the programmed conductance of the selected RRAM cell is greater than the selected target conductance, the programmed conductance error is represented by a positive number. Accordingly, the first error corrected target conductance would be the first target conductance of the first neighboring RRAM cell reduced by all, some, or none of the programmed conductance error of the selected RRAM cell, depending on the value of first factor x.

If the programmed conductance of the selected RRAM cell is less than the selected target conductance, the programmed conductance error is represented by a negative number. Accordingly, the first error corrected target conductance would be the first target conductance of the first neighboring RRAM cell reduced by all, some or none of the negative programmed conductance error of the selected RRAM cell. In such an example, depending on the value of first factor x, the first factor of the programmed conductance error of the selected RRAM cell would be effectively added to the first target conductance of the first neighboring RRAM cell (e.g., $G_{n+1}^T - x \cdot (-\Delta G_n^E)$).

As described above in relation to step 160 of FIG. 1A, the first neighboring RRAM cell may be programmed with the first error corrected target conductance by applying a particular voltage, current, or combination thereof across the terminals of the first neighboring RRAM cell. Depending on the first error corrected target conductance, the applied voltage, current, or combination thereof may be correspondingly higher or lower in order to program the first neighboring RRAM cell to have the first error corrected target conductance.

At 164 of FIG. 1B, a second neighboring RRAM cell may be programmed with a second error corrected target conductance that is a function of a second target conductance and the programmed conductance error of the selected RRAM cell. In the example of FIG. 1B, the second neighboring RRAM cell may refer to a cell that is adjacent to the selected RRAM cell and in the same row or the same column as the selected RRAM cell and the first neighboring RRAM cell. As an example, if the selected RRAM cell is an nth cell in a column or row of the RRAM array, the second neighboring RRAM cell may be represented as either the "n+1" or "n−1" cell, depending on which of the two represents the first neighboring RRAM cell. In another example, if the selected RRAM cell is depicted by $RC_{2,3}$ of FIG. 2, the second neighboring RRAM cell may be one of $RC_{2,2}$, $RC_{2,4}$, $RC_{1,3}$, or $RC_{3,3}$ of FIG. 2 other than the first neighboring RRAM cell. For instance, if the first neighboring RRAM cell in the example is $RC_{2,2}$, the second neighboring RRAM cell would be $RC_{2,4}$. If, however, the first neighboring RRAM cell in the example is $RC_{1,3}$, the second neighboring RRAM cell would be $RC_{3,3}$. Depending on the selected RRAM cell, the first and second neighboring cells may change.

As used herein, the second target conductance is the ideal conductance of the second neighboring RRAM cell for the RRAM array to perform the analog computation. The second target conductance for the second neighboring RRAM cell is the conductance the second neighboring RRAM cell would have if programming were error-free. The second error corrected target conductance of the second neighboring RRAM cell may be the second target conductance adjusted by some, all, or, in some examples, none of the programmed conductance error of the selected RRAM cell, as determined at step 140 of FIG. 1A. The second error corrected target conductance may also be a function of error associated with other RRAM cells, a constant error value, or the like.

In some examples, the second error corrected conductance $G_{n-1}^{ET}$ is represented by $$G_{n-1}^{ET} = G_{n-1}^T - y \cdot \Delta G_n^E \quad (2)$$

where $G_{n-1}^T$ is the second target conductance of the second neighboring RRAM cell, $\Delta G_n^E$ is the programmed conductance error of the selected RRAM cell, and y is a second factor, wherein 0≤y≤1. In such examples, the second error corrected target conductance of the second neighboring RRAM cell is reduced by a second factor y of the programmed conductance error of the selected RRAM cell where y is a positive fraction equal to or between 0 and 1.

If the programmed conductance of the selected RRAM cell is greater than the selected target conductance, the programmed conductance error is represented by a positive number. Accordingly, the second error corrected target conductance would be the second target conductance of the second neighboring RRAM cell reduced by all, some, or, in some examples, none of the programmed conductance error of the selected RRAM cell, depending on the value of second factor y.

If the programmed conductance of the selected RRAM cell is less than the selected target conductance, the programmed conductance error is represented by a negative number. Accordingly, the second error corrected target conductance would be the second target conductance of the second neighboring RRAM cell reduced by all, some or none of the negative programmed conductance error of the selected RRAM cell. In such an example, depending on the value of second factor y, the second factor of the programmed conductance error of the selected RRAM cell would be effectively added to the second target conductance of the second neighboring RRAM cell (e.g., $G_{n-1}^T - y \cdot (-\Delta G_n^E)$).

As described above in relation to step 160 of FIG. 1A, the second neighboring RRAM cell may be programmed with the second error corrected target conductance by applying a particular voltage, current, or combination thereof across the terminals of the second neighboring RRAM cell. Depending on the second error corrected target conductance, the applied voltage, current, or combination thereof may be correspondingly higher or lower in order to program the second neighboring RRAM cell to have the second error corrected target conductance.

In some examples in which the first error corrected conductance is represented by equation (1) and the second error corrected conductance is represented by equation (2), the sum of the first factor x and the second factor y may be equal to 1 (x+y=1). Thus, the total programmed conductance error of the selected RRAM cell may be distributed to the first and second neighboring RRAM cells (at least ideally, as each of the first and second neighboring RRAM cells may themselves have a programmed conductance error associated with them after programming). In some such examples, the first factor x may equal the second factor y (x=y) such that each of the first target conductance and the second target conductance are adjusted by half of the programmed conductance error of the selected RRAM cell. In other such examples, first factor x may be greater or less than second factor y such that the first neighboring RRAM cell is adjusted by a greater or a lesser amount than the second neighboring RRAM cell. For instance, first factor x may be set to 1 and second factor y may be set to 0 such that the total programmed conductance error of the selected RRAM cell is distributed only to a first neighboring RRAM cell.

In other examples in which the first error corrected conductance is represented by equation (1) and the second error corrected conductance is represented by equation (2), the sum of the first factor x and the second factor y may be less than or greater than 1. For example, a conductance amount greater than the programmed conductance error of the selected RRAM cell may be distributed to the first and second neighboring RRAM cells. Thus, the sum of the first factor x and the second factor y would be greater than 1. In another example, a conductance amount less than the programmed conductance error of the selected RRAM cell may be distributed to the first and second neighboring RRAM cells. Thus, the sum of the first factor x and the second factor y would be less than 1. Adjusting the first target conductance and the second target conductance of the first and second RRAM cells, respectively, by a sum that is greater than or less than the programmed conductance error of the selected RRAM cell may account for known or typical programming errors that may result.

Although the flowchart of FIG. 1B shows a specific order of performance of certain functionalities, method 160b is not limited to that order. For example, the functionalities shown in succession in the flowchart may be performed in a different order, may be executed concurrently or with partial concurrence, or a combination thereof. In some examples, functionalities described herein in relation to FIG. 1B may be provided in combination with functionalities described herein in relation to any of FIGS. 2-5.

FIG. 1C is a flowchart of an example method 160c of programming a neighboring RRAM cell with error corrected target conductance, as described above in relation to step 160 of method 100 of FIG. 1A. As shown, method 160c may comprise steps 162, 164, 166, and 168. At 162, a first neighboring RRAM cell may be programmed with a first error corrected target conductance that is a function of a first target conductance and the programmed conductance error of the selected RRAM cell, as described above in relation to 162 of FIG. 1B. At 164, a second neighboring RRAM cell may be programmed with a second error corrected target conductance that is a function of a second target conductance and the programmed conductance error of the selected RRAM cell, as described above in relation to 164 of FIG. 1B.

At 166 of FIG. 1C, a third neighboring RRAM cell may be programmed with a third error corrected target conductance that is a function of a third target conductance and the programmed conductance error of the selected RRAM cell. In the example of FIG. 1C, the third neighboring RRAM cell may refer to a cell that is proximate to the selected RRAM cell, adjacent to the first or second neighboring RRAM cell, and in the same row or the same column as the selected RRAM cell and the first and second neighboring RRAM cells. As an example, if the selected RRAM cell is an nth cell in a column or row of the RRAM array and the first neighboring RRAM cell is represented as the "n+1" or "n−1" cell, the third neighboring RRAM cell may be represented as the "n+2" or "n−2" cell, respectively. In another example, if the selected RRAM cell is depicted by $RC_{2,3}$ of FIG. 2, and the first neighboring RRAM cell is depicted by $RC_{2,4}$ of FIG. 2, the third neighboring RRAM cell may be depicted by $RC_{2,5}$ (not expressly shown in FIG. 2).

As used herein, the third target conductance is the ideal conductance of the third neighboring RRAM cell for the RRAM array to perform the analog computation. The third target conductance for the third neighboring RRAM cell is the conductance the third neighboring RRAM cell would have if programming were error-free. The third error corrected target conductance of the third neighboring RRAM cell may be the third target conductance adjusted by some, all, or, in some examples, none of the programmed conductance error of the selected RRAM cell, as determined at step 140 of FIG. 1A. The third error corrected target conductance may also be a function of error associated with other RRAM cells, a constant error value, or the like.

In some examples, the third error corrected target conductance $G_{n+2}^{ET}$ is represented by $$G_{n+2}^{ET} = G_{n+2}^{T} - a \cdot \Delta G_{n}^{E} \qquad (3)$$

where $G_{n+2}^{T}$ is the third target conductance of the third neighboring RRAM cell, $\Delta G_{n}^{E}$ is the programmed conductance error of the selected RRAM cell, and a is a third factor, wherein 0≤a≤1. In such examples, the third error corrected target conductance of the third neighboring RRAM cell is reduced by a third factor a of the programmed conductance error of the selected RRAM cell where a is a positive fraction equal to or between 0 and 1.

If the programmed conductance of the selected RRAM cell is greater than the selected target conductance, the programmed conductance error is represented by a positive number. Accordingly, the third error corrected target conductance would be the third target conductance of the third neighboring RRAM cell reduced by all, some, or none of the programmed conductance error of the selected RRAM cell, depending on the value of third factor a.

If the programmed conductance of the selected RRAM cell is less than the selected target conductance, the programmed conductance error is represented by a negative number. Accordingly, the third error corrected target conductance would be the third target conductance of the third neighboring RRAM cell reduced by all, some or none of the negative programmed conductance error of the selected RRAM cell. In such an example, depending on the value of third factor a, the third factor of the programmed conductance error of the selected RRAM cell would be effectively added to the third target conductance of the third neighboring RRAM cell (e.g., $G_{n+2}^{T} - a \cdot (-\Delta G_{n}^{E})$).

As described above in relation to step 160 of FIG. 1A, the third neighboring RRAM cell may be programmed with the third error corrected target conductance by applying a particular voltage, current, or combination thereof across the terminals of the third neighboring RRAM cell. Depending on the third error corrected target conductance, the applied voltage, current, or combination thereof may be correspondingly higher or lower in order to program the third neighboring RRAM cell to have the third error corrected target conductance.

At 168 of FIG. 1C, a fourth neighboring RRAM cell may be programmed with a fourth error corrected target conductance that is a function of a fourth target conductance and the programmed conductance error of the selected RRAM cell. In the example of FIG. 1C, the fourth neighboring RRAM cell may refer to a cell that is proximate to the selected RRAM cell, adjacent to the first or second neighboring RRAM cell, different from the third neighboring RRAM cell, and in the same row or the same column as the selected RRAM cell and the first and second neighboring RRAM cells. As an example, if the selected RRAM cell is an nth cell in a column or row of the RRAM array and the second neighboring RRAM cell is represented as the "n+1" or "n−1" cell, the fourth neighboring RRAM cell may be represented as the "n+2" or "n−2" cell, respectively. In another example, if the selected RRAM cell is depicted by $RC_{2,3}$ of FIG. 2, and the second neighboring RRAM cell is depicted by $RC_{2,2}$ of FIG. 2, the fourth neighboring RRAM cell may be depicted a $RC_{2,1}$. Depending on the selected RRAM cell, the neighboring cells may change.

As used herein, the fourth target conductance is the ideal conductance of the fourth neighboring RRAM cell for the RRAM array to perform the analog computation. The fourth target conductance for the fourth neighboring RRAM cell is the conductance the fourth neighboring RRAM cell would have if programming were error-free. The fourth error corrected target conductance of the fourth neighboring RRAM cell may be the fourth target conductance adjusted by some, all, or, in some examples, none of the programmed conductance error of the selected RRAM cell, as determined at step 140 of FIG. 1A. The fourth error corrected target conductance may also be a function of error associated with other RRAM cells, a constant error value, or the like.

In some examples, the fourth error corrected conductance $G_{n-2}^{ET}$ is represented by $$G_{n-2}^{ET} = GT_{n-2}^{T} - b \cdot \Delta G_n^{E} \quad (4)$$

where $G_{n-2}^{T}{}_{-2}$ is the fourth target conductance of the fourth neighboring RRAM cell, $\Delta G_n^{E}$ is the programmed conductance error of the selected RRAM cell, and b is a fourth factor, wherein 0≤b≤1. In such examples, the fourth error corrected target conductance of the fourth neighboring RRAM cell is reduced by a fourth factor of the programmed conductance error of the selected RRAM cell where b is a positive fraction equal to or between 0 and 1.

If the programmed conductance of the selected RRAM cell is greater than the selected target conductance, the programmed conductance error is represented by a positive number. Accordingly, the fourth error corrected target conductance would be the fourth target conductance of the fourth neighboring RRAM cell reduced by all, some, or, in some examples, none of the programmed conductance error of the selected RRAM cell, depending on the value of fourth factor b.

If the programmed conductance of the selected RRAM cell is less than the selected target conductance, the programmed conductance error is represented by a negative number. Accordingly, the fourth error corrected target conductance would be the fourth target conductance of the fourth neighboring RRAM cell reduced by all, some or none of the negative programmed conductance error of the selected RRAM cell. In such an example, depending on the value of fourth factor b, the fourth factor of the programmed conductance error of the selected RRAM cell would be effectively added to the fourth target conductance of the fourth neighboring RRAM cell (e.g., $G_{n-2}^{T} - b \cdot (-\Delta G_n^{E})$).

As described above in relation to step 160 of FIG. 1A, the fourth neighboring RRAM cell may be programmed with the fourth error corrected target conductance by applying a particular voltage, current, or combination thereof across the terminals of the fourth neighboring RRAM cell. Depending on the fourth error corrected target conductance, the applied voltage, current, or combination thereof may be correspondingly higher or lower in order to program the fourth neighboring RRAM cell to have the fourth error corrected target conductance.

In some examples in which the first error corrected conductance is represented by equation (1), the second error corrected conductance is represented by equation (2), the third error corrected conductance is represented by equation (3), and the fourth error corrected conductance is represented by equation (4), the sum of the first factor x, the second factor y, the third factor a, and the fourth factor b may be equal to 1 (x+y+a+b=1). Thus, the total programmed conductance error of the selected RRAM cell may be distributed to the first, second, third, and fourth neighboring RRAM cells (at least ideally, as each of the first, second, third, and fourth neighboring RRAM cells may themselves have a programmed conductance error associated with them after programming). In some examples, the programmed conductance error of the selected RRAM cell may be equally distributed amongst the first, second, third, and fourth neighboring RRAM cells. In other examples, the programmed conductance error of the selected RRAM cell may be variously distributed amongst the first, second, third, and fourth neighboring RRAM cells. For instance, the first and second neighboring RRAM cells may be adjusted with a greater portion of the programmed conductance error than the third and fourth neighboring RRAM cells, or vice versa.

In other examples, some neighboring RRAM cells may not be adjusted at all. For instance, in an example in which the selected RRAM cell is the nth cell in a row, the first neighboring RRAM cell is the "n+1" cell, the second neighboring RRAM cell is the "n-1" cell, the third neighboring RRAM cell is the "n+2" cell, and the fourth neighboring RRAM cell is the "n-2" cell, a first factor x and a third factor a may be set to 0 such that only the two cells to the left of the selected RRAM cell in the row are adjusted by the programmed conductance error of the selected RRAM cell.

In yet other examples, the sum of the factors may be less than or greater than 1. For example, a conductance amount greater than the programmed conductance error of the selected RRAM cell may be distributed to the neighboring RRAM cells such that the sum of the factors would be greater than 1. In another example, a conductance amount less than the programmed conductance error of the selected RRAM cell may be distributed to the neighboring RRAM cells such that the sum of the factors would be less than 1.

Although the flowchart of FIG. 1C shows a specific order of performance of certain functionalities, method 160c is not limited to that order. For example, the functionalities shown in succession in the flowchart may be performed in a different order, may be executed concurrently or with partial concurrence, or a combination thereof. In some examples, functionalities described herein in relation to FIG. 1C may be provided in combination with functionalities described herein in relation to any of FIGS. 2-5.

FIG. 1D is a flowchart of an example method 160d of programming a neighboring RRAM cell with error corrected target conductance, as described above in relation to step 160 of method 100 of FIG. 1A. As shown, method 160d may comprise steps 162, 164, 170, and 172. At 162, a first neighboring RRAM cell may be programmed with a first error corrected target conductance that is a function of a first target conductance and the programmed conductance error of the selected RRAM cell, as described above in relation to 162 of FIG. 1B. At 164, a second neighboring RRAM cell may be programmed with a second error corrected target conductance that is a function of a second target conductance and the programmed conductance error of the selected RRAM cell, as described above in relation to 164 of FIG. 1B.

At 170 of FIG. 1D, a third neighboring RRAM cell may be programmed with a third error corrected target conductance that is a function of a third target conductance and the programmed conductance error of the first neighboring RRAM cell. In the example of FIG. 1D, the third neighboring RRAM cell may refer to a cell that is proximate to the selected RRAM cell, adjacent to the first neighboring RRAM cell, and in the same row or the same column as the selected RRAM cell and the first neighboring RRAM cell. As an example, if the selected RRAM cell is an nth cell in a column or row of the RRAM array and the first neighboring RRAM cell is represented as the "n+1" cell, the third neighboring RRAM cell may be represented as the "n+2" cell. In another example, if the selected RRAM cell is depicted by $RC_{2,3}$ of FIG. 2, and the first neighboring RRAM cell is depicted by $RC_{2,4}$ of FIG. 2, the third neighboring RRAM cell may be depicted by $RC_{2,5}$ (not expressly shown in FIG. 2).

As described above in relation to FIG. 1C, the third target conductance is the ideal conductance of the third neighboring RRAM cell for the RRAM array to perform the analog computation. The third target conductance for the third neighboring RRAM cell is the conductance the third neighboring RRAM cell would have if programming were error-free. The third error corrected target conductance of the third neighboring RRAM cell may be the third target conductance adjusted by some, all, or, in some examples, none of the programmed conductance error of the first neighboring RRAM cell. The third error corrected target conductance may also be a function of error associated with other RRAM cells like the selected RRAM cell, a constant error value, or the like.

As described above in relation to the programmed conductance error of the selected RRAM cell, the programmed conductance error of the first neighboring RRAM cell may be determined by measuring the actual programmed conductance of the first neighboring RRAM cell reduced by the error corrected target conductance of the first neighboring RRAM cell.

In some examples, the third error corrected target conductance $G_{n+2}^{ET}$ is represented by $$G_{n+2}^{ET}=G_{n+2}^{T}-a\cdot\Delta G_{n+1}^{E} \quad (5)$$

where $G_{n+2}^{T}$ is the third target conductance of the third neighboring RRAM cell, $\Delta G_{n+1}^{E}$ is the programmed conductance error of the first neighboring RRAM cell, and a is a third factor, wherein $0 \leq a \leq 1$. In such examples, the third error corrected target conductance of the third neighboring RRAM cell is reduced by a third factor a of the programmed conductance error of the first neighboring RRAM cell where a is a positive fraction equal to or between 0 and 1.

If the programmed conductance of the first neighboring RRAM cell is greater than the error corrected target conductance of the first neighboring RRAM cell, the programmed conductance error is represented by a positive number. Accordingly, the third error corrected target conductance would be the third target conductance of the third neighboring RRAM cell reduced by all, some, or none of the programmed conductance error of the first neighboring RRAM cell, depending on the value of third factor a.

If the programmed conductance of the first neighboring RRAM cell is less than the error corrected target conductance of the first neighboring RRAM cell, the programmed conductance error is represented by a negative number. Accordingly, the third error corrected target conductance would be the third target conductance of the third neighboring RRAM cell reduced by all, some or none of the negative programmed conductance error of the first neighboring RRAM cell. In such an example, depending on the value of third factor a, the third factor of the programmed conductance error of the first neighboring RRAM cell would be effectively added to the third target conductance of the third neighboring RRAM cell (e.g., $G_{n+2}^{T}-a\cdot(-\Delta G_{n+1}^{E})$).

As described above in relation to step 166 of FIG. 1C, the third neighboring RRAM cell may be programmed with the third error corrected target conductance by applying a particular voltage, current, or combination thereof across the terminals of the third neighboring RRAM cell. Depending on the third error corrected target conductance, the applied voltage, current, or combination thereof may be correspondingly higher or lower in order to program the third neighboring RRAM cell to have the third error corrected target conductance.

At 172 of FIG. 1D, a fourth neighboring RRAM cell may be programmed with a fourth error corrected target conductance that is a function of a fourth target conductance and the programmed conductance error of the second neighboring RRAM cell. In the example of FIG. 1D, the fourth neighboring RRAM cell may refer to a cell that is proximate to the selected RRAM cell, adjacent to the second neighboring RRAM cell, and in the same row or the same column as the selected RRAM cell and the first, second, and third neighboring RRAM cells. As an example, if the selected RRAM cell is an nth cell in a column or row of the RRAM array and the second neighboring RRAM cell is represented as the "n−1" cell, the fourth neighboring RRAM cell may be represented as the "n−2" cell. In another example, if the selected RRAM cell is depicted by $RC_{2,3}$ of FIG. 2, and the second neighboring RRAM cell is depicted by $RC_{2,2}$ of FIG. 2, the fourth neighboring RRAM cell may be depicted a $RC_{2,1}$. Depending on the selected RRAM cell, the neighboring cells may change.

As described above in relation to FIG. 1C, the fourth target conductance is the ideal conductance of the fourth neighboring RRAM cell for the RRAM array to perform the analog computation. The fourth target conductance for the fourth neighboring RRAM cell is the conductance the fourth neighboring RRAM cell would have if programming were error-free. The fourth error corrected target conductance of the fourth neighboring RRAM cell may be the fourth target conductance adjusted by some, all, or, in some examples, none of the programmed conductance error of the second neighboring RRAM cell. The fourth error corrected target conductance may also be a function of error associated with other RRAM cells like the selected RRAM cell, a constant error value, or the like.

As described above in relation to the programmed conductance error of the selected RRAM cell, the programmed conductance error of the second neighboring RRAM cell may be determined by measuring the actual programmed conductance of the second neighboring RRAM cell reduced by the error corrected target conductance of the second neighboring RRAM cell.

In some examples, the fourth error conductance $G_{n-2}^{ET}$ is represented by $$G_{n-2}^{ET}=G_{n-2}^{ET}-b\cdot\Delta G_{n-2}^{ET} \quad (6)$$

where $G_{n-2}^{T}$ is the fourth target conductance of the fourth neighboring RRAM cell, $\Delta G_{n-1}^{E}$ is the programming conductance error of the second neighboring RRAM cell, and b is a fourth factor, wherein $0 \leq b \leq 1$. In such examples, the fourth error corrected target conductance of the fourth neighboring RRAM cell is reduced by a fourth factor of the programmed conductance error of the second neighboring RRAM cell where b is a positive fraction equal to or between 0 and 1.

If the programmed conductance of the second neighboring RRAM cell is greater than the error corrected target conductance of the second neighboring RRAM cell, the programmed conductance error is represented by a positive number. Accordingly, the fourth error corrected target conductance would be the fourth target conductance of the fourth neighboring RRAM cell reduced by all, some, or, in some examples, none of the programmed conductance error of the second neighboring RRAM cell, depending on the value of fourth factor b.

If the programmed conductance of the second neighboring RRAM cell is less than the selected target conductance, the programmed conductance error is represented by a negative number. Accordingly, the fourth error corrected target conductance would be the fourth target conductance of the fourth neighboring RRAM cell reduced by all, some or none of the negative programmed conductance error of the second neighboring RRAM cell. In such an example, depending on the value of fourth factor b, the fourth factor of the programmed conductance error of the second neighboring RRAM cell would be effectively added to the fourth target conductance of the fourth neighboring RRAM cell (e.g., $G_{n-2}^T - b \cdot (-\Delta G_{n-1}^E)$).

As described above in relation to step 168 of FIG. 1C, the fourth neighboring RRAM cell may be programmed with the fourth error corrected target conductance by applying a particular voltage, current, or combination thereof across the terminals of the fourth neighboring RRAM cell. Depending on the fourth error corrected target conductance, the applied voltage, current, or combination thereof may be correspondingly higher or lower in order to program the fourth neighboring RRAM cell to have the fourth error corrected target conductance.

In some examples in which the first error corrected conductance is represented by equation (1) and the second error corrected conductance is represented by equation (2), the sum of the first factor x and the second factor y may be equal to 1 (x+y=1). Thus, the total programmed conductance error of the selected RRAM cell may be distributed to the first and second neighboring RRAM cells (at least ideally, as each of the first and second neighboring RRAM cells may themselves have a programmed conductance error associated with them after programming). As described above, in some examples, the programmed conductance error of the selected RRAM cell may be equally or unequally distributed amongst the first and second neighboring RRAM cells.

In some examples in which the third error corrected conductance is represented by equation (5) and the fourth error corrected conductance is represented by equation (6), factors a and b may be equal to 1 such that the total programmed conductance error of the first neighboring RRAM cell and the second neighboring RRAM cell are distributed to the third and fourth neighboring RRAM cells, respectively (at least ideally, as each of the third and fourth neighboring RRAM cells may themselves have a programmed conductance error associated with them after programming). In other examples, the programmed conductance error of the first and second neighboring RRAM cells may also be distributed to other neighboring RRAM cells.

In other examples, some neighboring RRAM cells may not be adjusted at all. For instance, in an example in which the selected RRAM cell is the nth cell in a row, the first neighboring RRAM cell is the "n+1" cell and the second neighboring RRAM cell is the "n−1" cell, a first factor x may be set to 0 such that only the cell to the left of the selected RRAM cell in the row is adjusted by the programmed conductance error of the selected RRAM cell.

In yet other examples, the sum of the factors may be less than or greater than 1. For example, a conductance amount greater than the programmed conductance error of the selected RRAM cell may be distributed to the neighboring RRAM cells such that the sum of the factors would be greater than 1. In another example, a conductance amount less than the programmed conductance error of the selected RRAM cell may be distributed to the neighboring RRAM cells such that the sum of the factors would be less than 1.

Although the flowchart of FIG. 1D shows a specific order of performance of certain functionalities, method 160d is not limited to that order. For example, the functionalities shown in succession in the flowchart may be performed in a different order, may be executed concurrently or with partial concurrence, or a combination thereof. In some examples, functionalities described herein in relation to FIG. 1D may be provided in combination with functionalities described herein in relation to any of FIGS. 2-5.

Figure 2:
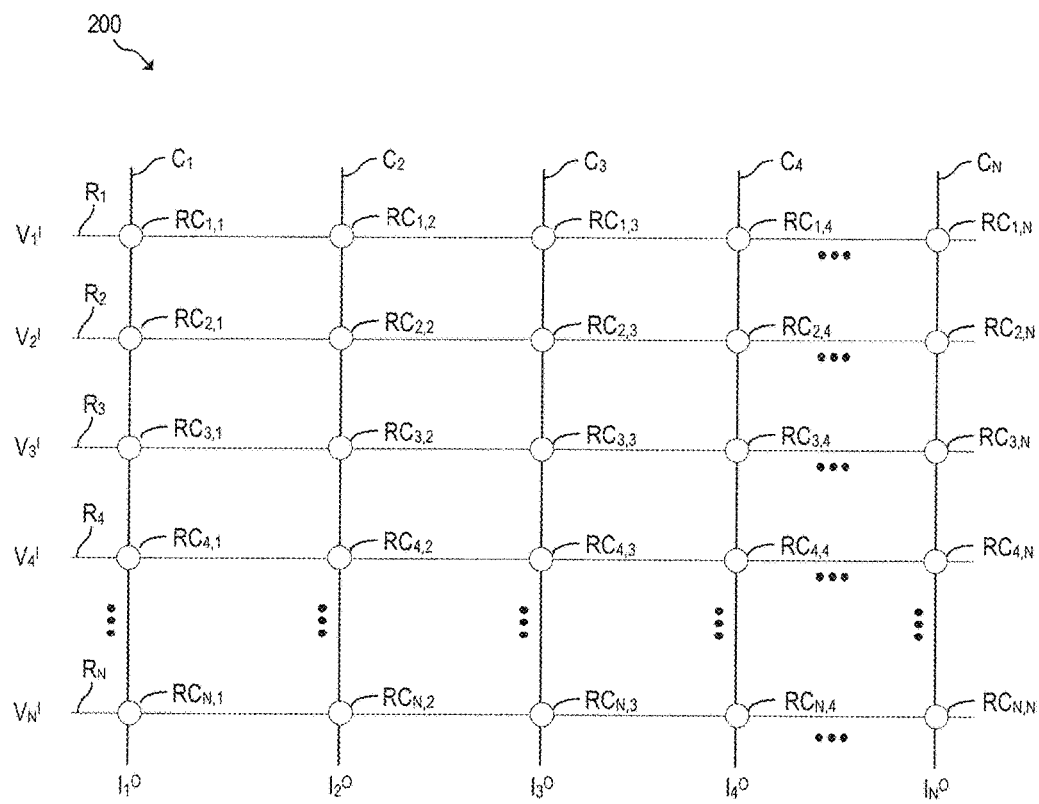
FIG. 2 is a block diagram of an example RRAM array that supports programming for an analog computation with a selected RRAM cell programmed with a selected target conductance and first and second neighboring RRAM cells programmed with first and second error corrected target conductance, respectively, that are each a function of a programmed conductance error of the selected RRAM cell.

FIG. 2 is a block diagram of an example resistive random access memory (RRAM) array 200 that is programmed for an analog computation. As used herein, RRAM may be a non-volatile random access memory in which state is determined by measuring resistance. As discussed above, an RRAM array is an arrangement of RRAM memory cells in rows and columns.

As depicted in FIG. 2, RRAM array 200 comprises row lines $R_1$, $R_2$, $R_3$, $R_4$, through $R_N$ and column lines $C_1$, $C_2$, $C_3$, $C_4$, through $C_N$. Although five row lines and five column lines are illustrated, RRAM array 200 may comprise any number of suitable row lines and column lines. In some examples, a symmetric array may have "N" row lines and "N" column lines, wherein "N" represents any suitable number of row lines and column lines. In other examples, an asymmetric array may have "N" and "N+z" number of row lines or column lines, wherein "z" represents any suitable number of lines.

In the example of FIG. 2, row lines $R_1$, $R_2$, $R_3$, $R_4$, through $R_N$ are perpendicular to column lines $C_1$, $C_2$, $C_3$, $C_4$, through $C_N$ such that each row line intersects each column line at a cross point. At each cross point is an RRAM cell represented by "RC" that indicates the row and column at which the RRAM cell is located. For instance, the RRAM cell in the first row and first column is labeled "$RC_{1,1}$". The RRAM cell in the first row and second column is labeled "$RC_{1,2}$" and so on.

In some examples, each RRAM cell may have a conductance G that indicates the row and column at which the RRAM cell is located. For instance, the conductance of RRAM cell $RC_{1,1}$ may be represented by $G_{1,1}$. The conductance of RRAM cell $RC_{1,2}$ may be represented by $G_{1,2}$, and so on. As shown, at each row line $R_1$, $R_2$, $R_3$, $R_4$, through $R_N$, a corresponding input voltage $V_1^I$, $V_2^I$, $V_3^I$, $V_4^I$, through $V_N^I$ may be applied. The application of an input voltage $V_1^I$ at row line $R_1$ yields an output current at each of the column lines of RRAM array 200. In one example, if an input voltage $V_1^I$ is applied at row line $R_1$ having an RRAM cell $RC_{1,2}$ with a conductance of $G_{1,2}$, an output current at column line $C_2$ may be represented by $I_2^O$.

A current through any RRAM cell yields the product of an input voltage and the programmed conductance. This current $I_j$ may be represented as $$I_j = G_{i,j} \cdot V_i \quad (7)$$

where $I_j$ represents a current I at a column j, $G_{i,j}$ represents a conductance G at row i and column j, and $V_i$ represents a voltage V at row i.

Because a current through any RRAM cell yields the product of an input voltage and the programmed conductance, a dot product may be computed for RRAM array 200. For instance, if an input voltage $V_i^I$ were applied to a row i of RRAM array 200, the dot product may be the vector of output currents $I_j^O$. This vector of output currents $I_j^O$ may be represented as $$I_j^O = \Sigma_i G_{i,j} \cdot V_i^I$$

where the vector of output currents is the sum of the product of a conductance G at row i and column j and an input voltage V at row i. Depending on the programmed conductance of the RRAM cells within RRAM array 200, the dot product may result in the application of a linear transformation, a convolution operation, or a neural network inference algorithm.

In some examples, the RRAM cells of RRAM array 200 may be programmed for an analog computation as described above in relation to FIGS. 1A, 1B, 1C, and/or 1D. In one example, RRAM cell $RC_{3,2}$ of RRAM array 200 may be the selected RRAM cell and may be programmed with a selected target conductance, as described above in relation to step 120 of FIG. 1A. The first neighboring RRAM cell may be one of $RC_{3,1}$, $RC_{3,3}$, $RC_{2,2}$, or $RC_{4,2}$. Assuming in this example that the first neighboring RRAM cell is $RC_{4,2}$, first neighboring RRAM cell $RC_{4,2}$ is programmed with a first error corrected target conductance, wherein the first error corrected target conductance is a function of a first target conductance and a programmed conductance error of the selected RRAM cell, as described above in relation to step 162 of FIG. 1B.

The second neighboring RRAM cell may also be one of $RC_{3,1}$, $RC_{3,3}$, $RC_{2,2}$, or $RC_{4,2}$ different from the first neighboring RRAM cell, but in the same row or column as the first neighboring RRAM cell and the selected RRAM cell. Because, in the example described herein, the selected RRAM cell is $RC_{3,2}$, and the first neighboring RRAM cell is $RC_{4,2}$, the second neighboring RRAM cell is $RC_{2,2}$. Second neighboring RRAM cell $RC_{4,2}$ is programmed with a second error corrected target conductance, wherein the second error corrected target conductance is a function of a second target conductance and the programmed conductance error of the selected RRAM cell, as described above in relation to step 164 of FIG. 1B. The selected RRAM cell, the first neighboring RRAM cell, and the second neighboring RRAM cell are programmed such that RRAM array 200 is programmed for the analog computation.

In some such examples, the first target conductance and the second target conductance may be together reduced by an amount equal to the programmed conductance error of the selected RRAM cell, as described above in relation to FIG. 1B. For instance, as described above, the first error corrected target conductance may be calculated by reducing the first target conductance by a first factor x of the programmed conductance error of the selected RRAM cell. The second error corrected target conductance may be calculated by reducing the second target conductance by a second factor y of the programmed conductance error of the selected RRAM cell. And, as described above in relation to FIG. 1B, in some examples, the sum of the first factor x and the second factor y may be equal to 1 (x+y=1) such that the first and second target conductance are together reduced by an amount equal to the programmed conductance error of the selected RRAM cell. In other examples, the first and second target conductance are together reduced by an amount greater than or less than the programmed conductance error of the selected RRAM cell.

In some examples, in which the selected RRAM cell is $RC_{3,2}$, the first neighboring RRAM cell is $RC_{4,2}$, and the second neighboring RRAM cell is $RC_{2,2}$, a third and fourth neighboring RRAM cell may be one of $RC_{5,2}$ (not shown) and $RC_{1,2}$, respectively. Third neighboring RRAM cell $RC_{5,2}$ is programmed with a third error corrected target conductance, wherein the third error corrected target conductance is a function of a third target conductance and a programmed conductance error of the selected RRAM cell, as described above in relation to step 166 of FIG. 1C. Fourth neighboring RRAM cell $RC_{1,2}$ is programmed with a fourth error corrected target conductance, wherein the fourth error corrected target conductance is a function of a fourth target conductance and a programmed conductance error of the selected RRAM cell, as described above in relation to step 168 of FIG. 1C. The selected RRAM cell and the first, second, third, and fourth neighboring RRAM cells are programmed such that RRAM array 200 is programmed for the analog computation.

In some such examples, the first, second, third, and fourth target conductance may be together reduced by an amount equal to the programmed conductance error of the selected RRAM cell, as described above in relation to FIG. 1C. For instance, as described above, the first error corrected target conductance may be calculated by reducing the first target conductance by a first factor x of the programmed conductance error of the selected RRAM cell. The second error corrected target conductance may be calculated by reducing the second target conductance by a second factor y of the programmed conductance error of the selected RRAM cell. The third error corrected target conductance may be calculated by reducing the third target conductance by a third factor a of the programmed conductance error of the selected RRAM cell. The fourth error corrected target conductance may be calculated by reducing the fourth target conductance by a fourth factor b of the programmed conductance error of the selected RRAM cell.

As described above in relation to FIG. 1C, in some examples, the sum of the first factor x, the second factor y, the third factor a, and the fourth factor b may be equal to 1 (x+y+a+b=1) such that the first, second, third, and fourth target conductance are together reduced by an amount equal to the programmed conductance error of the selected RRAM cell. In other examples, the first, second, third, and fourth target conductance are together reduced by an amount greater than or less than the programmed conductance error of the selected RRAM cell.

Although RRAM array 200 of FIG. 2 is described in relation to some of FIGS. 1A, 1B, and 1C, RRAM array 200 may be programmed for an analog computation according to any of the examples described above in relation to FIGS. 1A, 1B, 1C, and/or 1D. RRAM array 200 may also be programmed for the analog computation via a non-transitory machine-readable storage medium and processing resource as described below in relation to FIGS. 3A-3D or via any other suitable programming mechanism such as an application specific integrated circuit (ASIC), hard-coded logic, and the like.

Figure 3A:
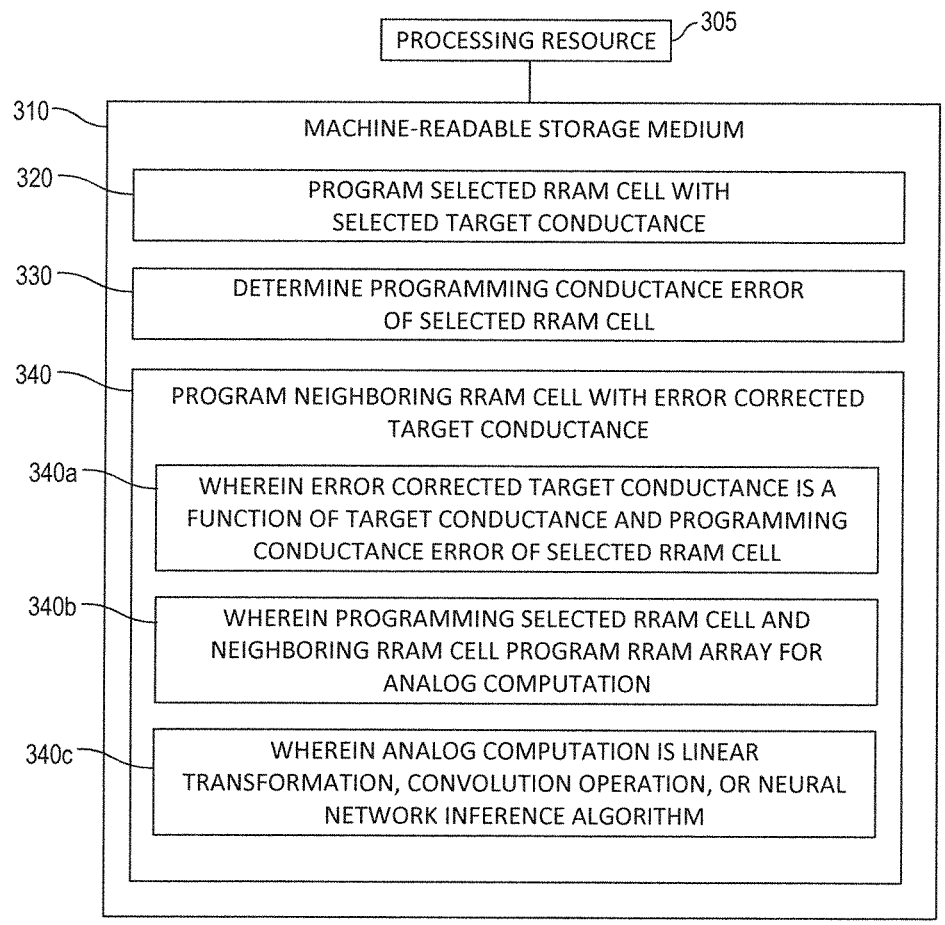
FIG. 3A is a block diagram of an example machine-readable storage medium having instructions executable by a processor to program an RRAM array for an analog computation in which a selected RRAM cell is programmed with a selected target conductance, and a neighboring RRAM cell is programmed to have an error corrected target conductance.

Further examples are described in relation to FIG. 3A. FIG. 3A is a block diagram of a non-transitory machine-readable storage medium 310 and a processing resource 305 to program an RRAM array for an analog computation. The machine-readable storage medium 310 comprises (e.g., is encoded with) instructions 320, 330, and 340 executable by processing resource 305 to implement functionalities described herein in relation to FIG. 3A. In some examples, storage medium 310 may include additional instructions. In other examples, the functionalities described herein in relation to instructions 320, 330, and 340, and any additional instructions described herein in relation to storage medium 310, may be implemented at least in part in electronic circuitry (e.g., via components comprising any combination of hardware and programming to implement the functionalities described herein).

In examples described herein, a processing resource may include, for example, one processor or multiple processors.

As used herein, a processor may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof. Processing resource 305 may fetch, decode, and execute instructions stored on storage medium 310 to perform the functionalities described below in relation to instructions 320, 330, and 340. In other examples, the functionalities of any of the instructions of storage medium 310 may be implemented in the form of electronic circuitry, in the form of executable instructions encoded on a machine-readable storage medium, or a combination thereof.

As used herein, a machine-readable storage medium may be any electronic, magnetic, optimal, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), network attached storage such as "cloud" storage (e.g., remote data storage accessible via the Internet), and the like, or a combination thereof. Further, any machine-readable storage medium described herein may be non-transitory. In the example of FIG. 3A, storage medium 310 may be implemented by one machine-readable storage medium, or multiple machine-readable storage media.

Instructions 320 program a selected RRAM cell of the RRAM array with a selected target conductance, as described above in relation to step 120 of FIG. 1A. Instructions 330 determine a programmed conductance error of the selected RRAM cell, as described above in relation to step 140 of FIG. 1A. Instructions 340 program a neighboring RRAM cell with an error corrected target conductance, as described above in relation to step 160 of FIG. 1A. Instructions 340 further comprise 340a, 340b, and 340c. 340a of instructions 340 involve programming the neighboring RRAM cell with an error corrected target conductance that is a function of a neighboring target conductance and the programmed conductance error of the selected RRAM cell, as described above in relation to step 160 of FIG. 1A. 340b of instructions 340 involve programming the selected RRAM cell and the neighboring RRAM cell such that the RRAM array is programmed for the analog computation, as described above in relation to step 160 of FIG. 1A. 340c of instructions 340 further involve the analog computation being a linear transformation, a convolution operation, or a neural network inference algorithm.

As described herein, instructions 320, 330, and 340 may be executed by processing resource 305 of a device (not shown). In some examples, instructions 320, 330, and 340 may be part of an installation package that, when installed, may be executed by processing resource 305 to implement the functionalities described above. In such examples, storage medium 310 may be a portable medium, such as a CD, DVD, or flash drive, or a memory maintained by a server from which the installation package can be downloaded and installed. In other examples, instructions 320, 330, and 340 may be part of an application, applications, or component(s) already installed on a device (not shown) including processing resource 305. In such examples, the storage medium 310 may include memory such as a hard drive, solid state drive, or the like. In some examples, functionalities described herein in relation to FIG. 3A may be provided in combination with functionalities described herein in relation to any of FIGS. 1-2, 3B-3D, and 4-5.

Figure 3B:
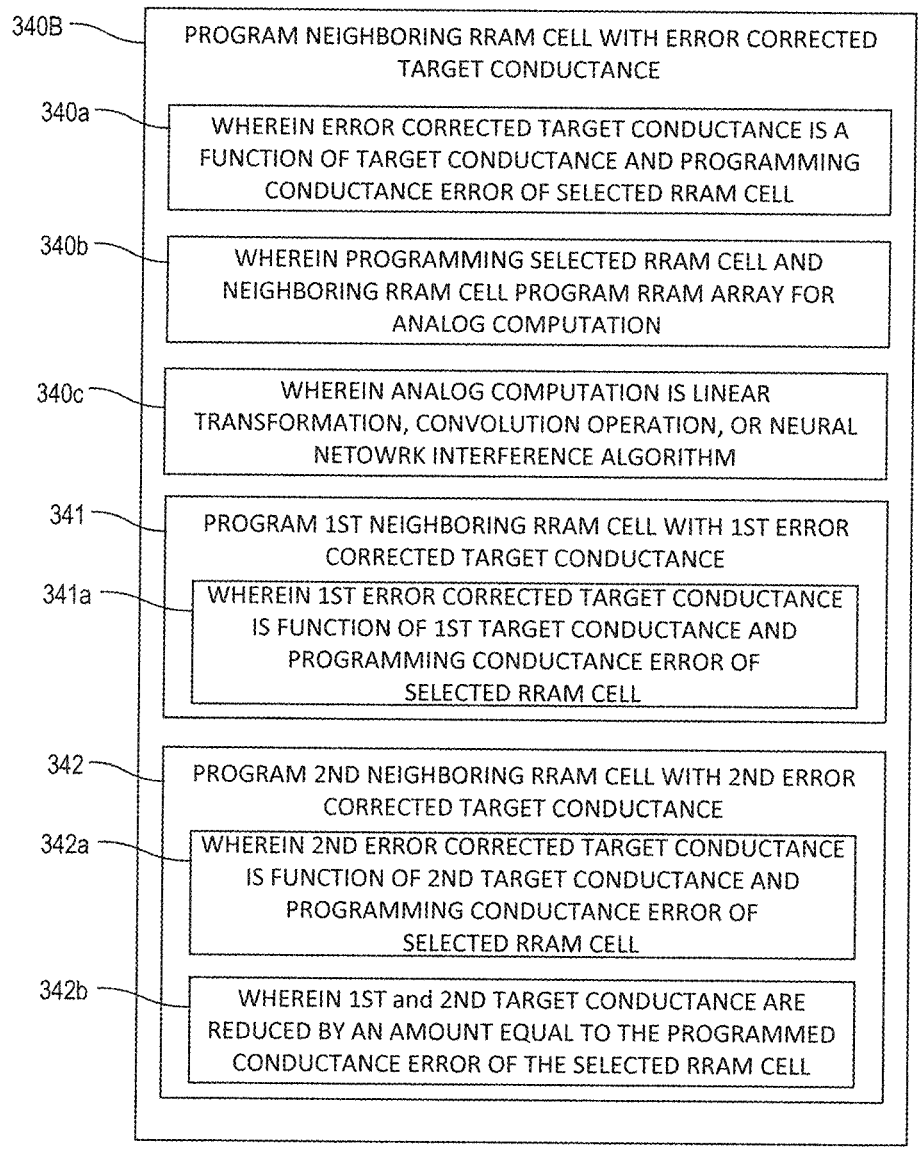
FIG. 3B is a block diagram of example instructions to program a neighboring RRAM cell that include programming first and second neighboring RRAM cells with first and second error corrected target conductance, respectively, that are a function of the programmed conductance error of the selected RRAM cell.
Figure 3C:
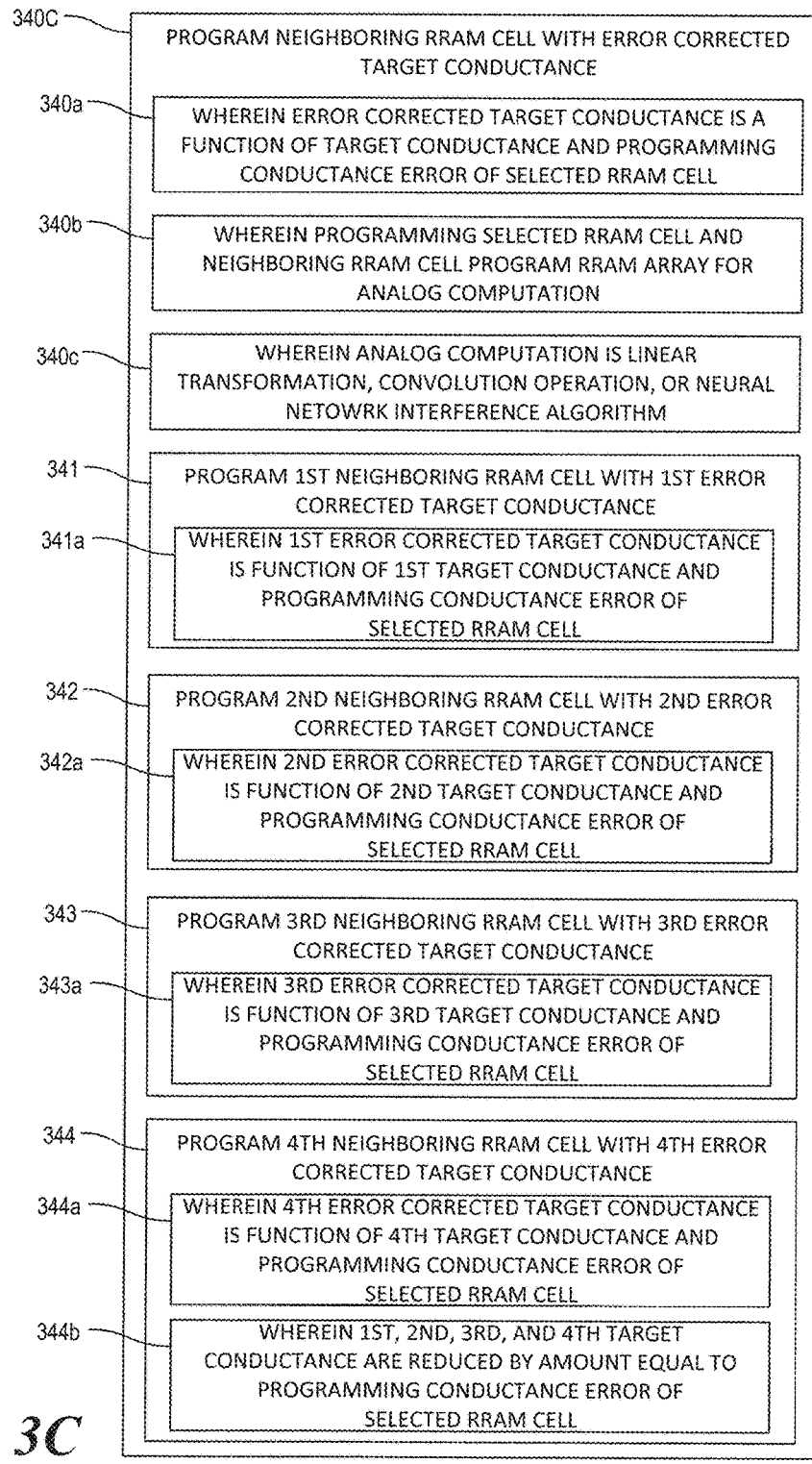
FIG. 3C is a block diagram of example instructions to program a neighboring RRAM cell that include programming first, second, third, and fourth neighboring RRAM cells with first, second, third, and fourth error corrected target conductance, respectively, that are a function of the programmed conductance error of the selected RRAM cell.
Figure 3D:
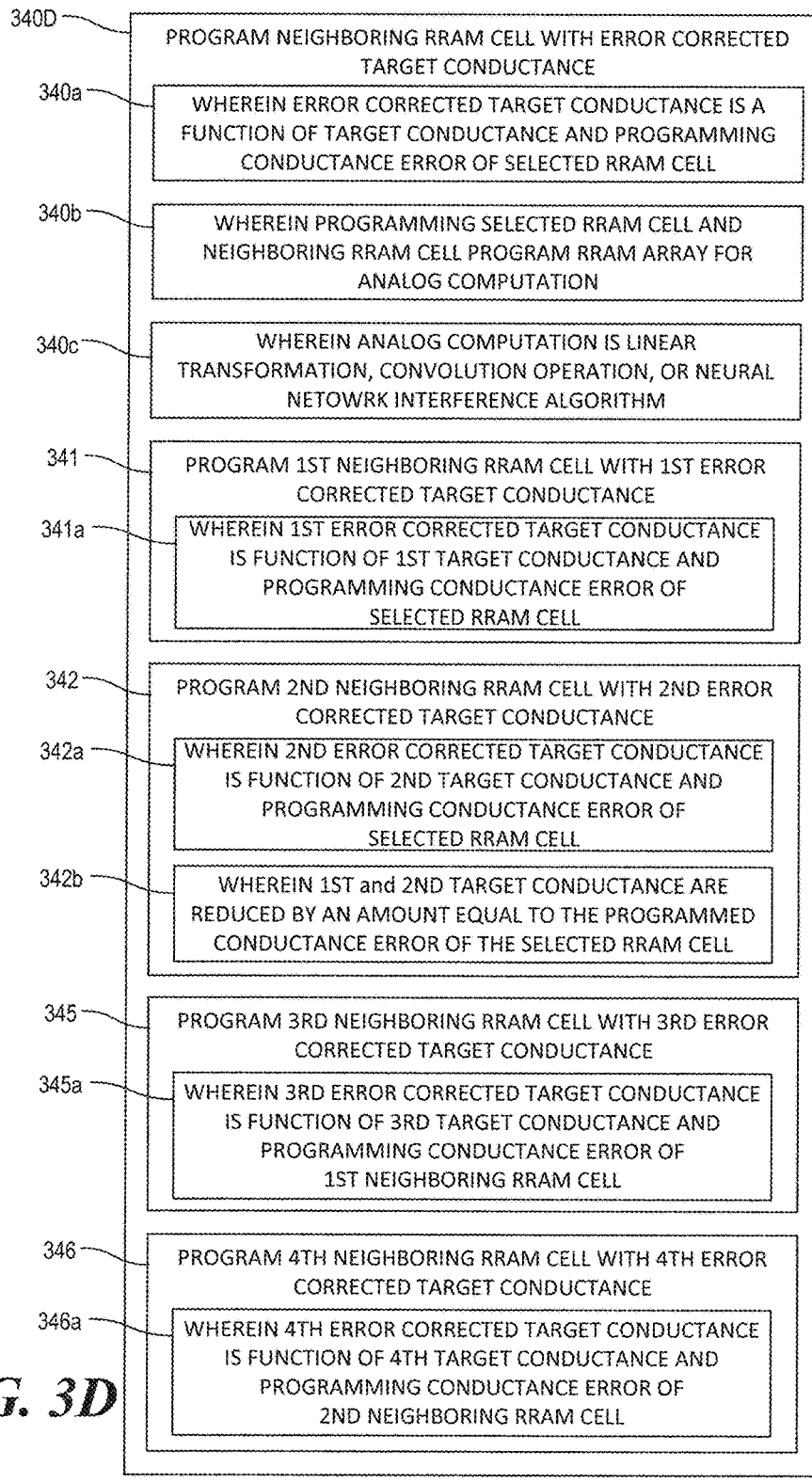
FIG. 3D is a block diagram of example instructions to program a neighboring RRAM cell that include programming first and second neighboring RRAM cells with first and second error corrected target conductance, respectively, that are a function of the programmed conductance error of the selected RRAM cell and that include programming third and fourth neighboring RRAM cells with third and fourth error corrected target conductance that are a function of the programmed conductance error of the first and second neighboring RRAM cell, respectively.

FIGS. 3B-3D depict further example instructions of instructions 340 of FIG. 3A, according to various examples. FIG. 3B is a block diagram of example instructions 340B of non-transitory machine-readable storage medium 310 to program a neighboring RRAM cell with error corrected target conductance, as described above in relation to instructions 340 of FIG. 3A. Instructions 340B further comprise instructions 341 and 342 executable by processing resource 305 to implement functionalities described herein in relation to FIG. 3B. In some examples, storage medium 310 may include additional instructions. In other examples, the functionalities described herein in relation to instructions 341 and 342, and any additional instructions described herein in relation to storage medium 310, may be implemented at least in part in electronic circuitry (e.g., via components comprising any combination of hardware and programming to implement the functionalities described herein).

Instructions 340B comprise 340a, 340b, and 340c, as described above in relation to FIG. 3A. Instructions 340B further comprise instructions 341 that program a first neighboring RRAM cell with a first error corrected target conductance, as described above in step 162 of FIG. 1B. Instructions 341 comprise 341a, which involves programming the first neighboring RRAM cell with a first error corrected target conductance that is a function of a first target conductance and the programmed conductance error of the selected RRAM cell, as described above in step 162 of FIG. 1B.

Instructions 340B also comprise instructions 342 that program a second neighboring RRAM cell with a second error corrected target conductance, as described above in step 164 of FIG. 1B. Instructions 342 also comprise 342a and 342b. 342a of instructions 342 involve programming the second neighboring RRAM cell with a second error corrected target conductance that is a function of a second target conductance and the programmed conductance error of the selected RRAM cell, as described above in relation to step 164 of FIG. 1B. 342b of instructions 342 involve reducing the first target conductance and the second target conductance by an amount equal to the programmed conductance error of the selected RRAM cell to calculate the first and second error corrected target conductance, as described above in relation to FIG. 1B.

As described herein, instructions 341 and 342 may be executed by processing resource 305 of a device (not shown). In some examples, instructions 341 and 342 may be part of an installation package that, when installed, may be executed by processing resource 305 to implement the functionalities described above. In such examples, storage medium 310 may be a portable medium, such as a CD, DVD, or flash drive, or a memory maintained by a server from which the installation package can be downloaded and installed. In other examples, instructions 341 and 342 may be part of an application, applications, or component(s) already installed on a device (not shown) including processing resource 305. In such examples, the storage medium 310 may include memory such as a hard drive, solid state drive, or the like. In some examples, functionalities described herein in relation to FIG. 3B may be provided in combination with functionalities described herein in relation to any of FIGS. 1-2, 3A, 3C-3D, and 4-5.

FIG. 3C is a block diagram of example instructions 340C of non-transitory machine-readable storage medium 310 to program a neighboring RRAM cell with error corrected target conductance, as described above in relation to instructions 340 of FIG. 3A. Instructions 340C further comprise instructions 341, 342, 343, and 344 executable by processing resource 305 to implement functionalities described herein in relation to FIG. 3C. In some examples, storage medium 310 may include additional instructions. In other examples, the functionalities described herein in relation to instructions 341, 342, 343, and 344, and any additional instructions described herein in relation to storage medium 310, may be implemented at least in part in electronic circuitry (e.g., via components comprising any combination of hardware and programming to implement the functionalities described herein).

Instructions 340C comprise 340a, 340b, and 340c, as described above in relation to FIG. 3A. Instructions 340C further comprise instructions 341, which comprises 341a, to program a first neighboring RRAM cell with a first error corrected target conductance that is a function of a first target conductance and the programmed conductance error of the selected RRAM cell, as described above in FIG. 3B. Instructions 340C also comprise instructions 342, which comprises 342a, to program a second neighboring RRAM cell with a second error corrected target conductance that is a function of a second target conductance and the programmed conductance error of the selected RRAM cell, as described above in FIG. 3B.

Instructions 340C also include instructions 343 and 344. Instructions 343 program a third neighboring RRAM cell with a third error corrected target conductance, as described above in step 166 of FIG. 1C. Instructions 343 comprise 343a, which involves programming the third neighboring RRAM cell with a third error corrected target conductance that is a function of a third target conductance and the programmed conductance error of the selected RRAM cell, as described above in relation to step 166 of FIG. 1C.

Instructions 344 program a fourth neighboring RRAM cell with a fourth error corrected target conductance, as described above in step 168 of FIG. 1C. Instructions 344 comprise 344a and 344b. 344a of instructions 344 involves programming the fourth neighboring RRAM cell with a fourth error corrected target conductance that is a function of a fourth target conductance and the programmed conductance error of the selected RRAM cell, as described above in step 168 of FIG. 1C. 344b of instructions 344 involve reducing the first, second, third, and fourth target conductance by an amount equal to the programmed conductance error of the selected RRAM cell to calculate the first, second, third, and fourth error corrected target conductance, as described above in relation to FIG. 1C.

As described herein, instructions 341, 342, 343, and 344 may be executed by processing resource 305 of a device (not shown). In some examples, instructions 341, 342, 343, and 344 may be part of an installation package that, when installed, may be executed by processing resource 305 to implement the functionalities described above. In such examples, storage medium 310 may be a portable medium, such as a CD, DVD, or flash drive, or a memory maintained by a server from which the installation package can be downloaded and installed. In other examples, instructions 341, 342, 343, and 344 may be part of an application, applications, or component(s) already installed on a device (not shown) including processing resource 305. In such examples, the storage medium 310 may include memory such as a hard drive, solid state drive, or the like. In some examples, functionalities described herein in relation to FIG. 3C may be provided in combination with functionalities described herein in relation to any of FIGS. 1-2, 3A-3B, 3D, and 4-5.

FIG. 3D is a block diagram of example instructions 340D of non-transitory machine-readable storage medium 310 to program a neighboring RRAM cell with error corrected target conductance, as described above in relation to instructions 340 of FIG. 3A. Instructions 340D further comprise instructions 341, 342, 345, and 346 executable by processing resource 305 to implement functionalities described herein in relation to FIG. 3D. In some examples, storage medium 310 may include additional instructions. In other examples, the functionalities described herein in relation to instructions 341, 342, 345, and 346, and any additional instructions described herein in relation to storage medium 310, may be implemented at least in part in electronic circuitry (e.g., via components comprising any combination of hardware and programming to implement the functionalities described herein).

Instructions 340D comprise 340a, 340b, and 340c, as described above in relation to FIG. 3A. Instructions 340D further comprise instructions 341, which comprises 341a, to program a first neighboring RRAM cell with a first error corrected target conductance that is a function of a first target conductance and the programmed conductance error of the selected RRAM cell, as described above in relation to FIG. 3B. Instructions 340D also comprise instructions 342, which comprises 342a, to program a second neighboring RRAM cell with a second error corrected target conductance that is a function of a second target conductance and the programmed conductance error of the selected RRAM cell, as described above in relation to FIG. 3B. Instructions 342 also comprises 342b, which involves reducing the first target conductance and the second target conductance by an amount equal to the programmed conductance error of the selected RRAM cell to calculate the first and second error corrected target conductance, as described above in relation to FIG. 3B.

Instructions 340D further includes instructions 345 and 346. Instructions 345 program a third neighboring RRAM cell with a third error corrected target conductance, as described above in step 170 of FIG. 1D. Instructions 345 comprise 345a, which involves programming the third neighboring RRAM cell with a third error corrected target conductance that is a function of a third target conductance and the programmed conductance error of the first neighboring RRAM cell, as described above in relation to step 170 of FIG. 1D.

Instructions 346 program a fourth neighboring RRAM cell with a fourth error corrected target conductance, as described above in step 172 of FIG. 1D. Instructions 346 comprises 346a, which involves programming the fourth neighboring RRAM cell with a fourth error corrected target conductance that is a function of a fourth target conductance and the programmed conductance error of the second neighboring RRAM cell, as described above in step 172 of FIG. 1D.

As described herein, instructions 341, 342, 345, and 346 may be executed by processing resource 305 of a device (not shown). In some examples, instructions 341, 342, 345, and 346 may be part of an installation package that, when installed, may be executed by processing resource 305 to implement the functionalities described above. In such examples, storage medium 310 may be a portable medium, such as a CD, DVD, or flash drive, or a memory maintained by a server from which the installation package can be downloaded and installed. In other examples, instructions 341, 342, 345, and 346 may be part of an application, applications, or component(s) already installed on a device (not shown) including processing resource 305. In such examples, the storage medium 310 may include memory such as a hard drive, solid state drive, or the like. In some examples, functionalities described herein in relation to FIG. 3D may be provided in combination with functionalities described herein in relation to any of FIGS. 1-2, 3A-3C, and 4-5.

What is claimed is:

1. A method of programming a resistive random access memory (RRAM) array for an analog computation, the method comprising:
    programming a selected RRAM cell of the RRAM array with a selected target conductance;
    determining a programmed conductance error of the selected RRAM cell; and
    programming a neighboring RRAM cell with an error corrected target conductance,
        wherein the neighboring RRAM cell is in a same row as the selected RRAM cell or a same column as the selected RRAM cell,
        wherein the error corrected target conductance is a function of a neighboring target conductance and the programmed conductance error of the selected RRAM cell; and
        wherein the selected RRAM cell and the neighboring RRAM cell are programmed such that the RRAM array is programmed for the analog computation.

2. The method of claim 1, wherein the selected RRAM cell of the RRAM array is an nth RRAM cell, where n is a nearest integer of N/2, and where N is a number of cells in a column or a row of the RRAM array and is a positive integer greater than one.

3. The method of claim 1, wherein programming the neighboring RRAM cell further comprises:
    programming a first neighboring RRAM cell with a first error corrected target conductance, wherein the first error corrected target conductance is a function of a first target conductance and the programmed conductance error of the selected RRAM cell; and
    programming a second neighboring RRAM cell with a second error corrected target conductance, wherein the second error corrected target conductance is a function of a second target conductance and the programmed conductance error of the selected RRAM cell.

4. The method of claim 3,
    wherein the first error corrected conductance is the first target conductance of the first neighboring RRAM cell reduced by a first factor of the programmed conductance error of the selected RRAM cell,
    wherein the second error corrected conductance is the second target conductance of the second neighboring RRAM cell reduced by a second factor of the programmed conductance error of the selected RRAM cell, and
    wherein the first factor and the second factor are each a positive fraction equal to or between 0 and 1.

5. The method of claim 4, wherein a sum of the first factor and the second factor is equal to 1.

6. The method of claim 5, wherein the first factor equals the second factor.

7. The method of claim 4, wherein programming the neighboring RRAM cell further comprises:
    programming a third neighboring RRAM cell with a third error corrected target conductance, wherein the third error corrected target conductance is a function of a third target conductance and the programmed conductance error of the selected RRAM cell; and
    programming a fourth neighboring RRAM cell with a fourth error corrected target conductance, wherein the fourth error corrected target conductance is a function of a fourth target conductance and the programmed conductance error of the selected RRAM cell.

8. The method of claim 7,
    wherein the third error corrected conductance is the third target conductance of the third neighboring RRAM cell reduced by a third factor of the programmed conductance error of the selected RRAM cell,
    wherein the fourth error corrected conductance is the fourth target conductance of the fourth neighboring RRAM cell reduced by a fourth factor of the programmed conductance error of the selected RRAM cell, and
    wherein the third factor and the fourth factor are each a positive fraction equal to or between 0 and 1.

9. The method of claim 8, wherein the sum of the first factor, the second factor, the third factor, and the fourth factor is equal to 1.

10. The method of claim 4, wherein programming the neighboring RRAM cell further comprises:
    programming a third neighboring RRAM cell with a third error corrected target conductance, wherein the third error corrected target conductance is a function of a third target conductance and a programmed conductance error of the first neighboring RRAM cell; and
    programming a fourth neighboring RRAM cell with a fourth error corrected target conductance, wherein the fourth error corrected target conductance is a function of a fourth target conductance and a programmed conductance error of the second RRAM cell.

11. The method of claim 10,
    wherein the third error corrected conductance is the third target conductance of the third neighboring RRAM cell reduced by a third factor of the programmed conductance error of the first neighboring RRAM cell,
    wherein the fourth error corrected conductance is the fourth target conductance of the fourth neighboring RRAM cell reduced by a fourth factor of the programmed conductance error of the second neighboring RRAM cell, and
    wherein the third factor and the fourth factor are each a positive fraction equal to or between 0 and 1.

12. A resistive random access memory (RRAM) array programmed for an analog computation comprising:
    a selected RRAM cell of the RRAM array that is programmed with a selected target conductance;
    a first neighboring RRAM cell that is programmed with a first error corrected target conductance, wherein the first error corrected target conductance is a function of a first target conductance and a programmed conductance error of the selected RRAM cell; and
    a second neighboring RRAM cell that is programmed with a second error corrected target conductance,
        wherein the second error corrected target conductance is a function of a second target conductance and the programmed conductance error of the selected RRAM cell, and
        wherein the selected RRAM cell, the first neighboring RRAM cell, and the second neighboring RRAM cell are programmed such that the RRAM array is programmed for the analog computation.

13. The RRAM array of claim 12, wherein the first neighboring RRAM cell and the second neighboring cell are adjacent to the selected RRAM cell in a same row as the selected RRAM cell or in a same column as the selected RRAM cell.

14. The RRAM array of claim 12, wherein the first target conductance and the second target conductance are together reduced by an amount equal to the programmed conductance error of the selected RRAM cell to calculate the first error corrected target conductance and the second error corrected target conductance.

15. The RRAM array of claim 14, further comprising:
a third neighboring RRAM cell that is programmed with a third error corrected target conductance, wherein the third error corrected target conductance is a function of a third target conductance and a programmed conductance error of the selected RRAM cell; and
a fourth neighboring RRAM cell that is programmed with a fourth error corrected target conductance,
wherein the fourth error corrected target conductance is a function of a fourth target conductance and the programmed conductance error of the selected RRAM cell, and
wherein the third neighboring RRAM cell and the fourth neighboring RRAM cell are programmed such that the RRAM array is programmed for the analog computation.

16. The RRAM array of claim 14, wherein the first target conductance, the second target conductance, the third target conductance, and the fourth target conductance are together reduced by an amount equal to the programmed conductance error of the selected RRAM cell to calculate the first error corrected conductance, the second error corrected conductance, the third error corrected conductance, and the fourth error corrected conductance.

17. A non-transitory machine-readable storage medium comprising instructions executable by a processing resource to program a resistive random access memory (RRAM) array for an analog computation, the instructions to:
program a selected RRAM cell of the RRAM array with a selected target conductance;
determine a programmed conductance error of the selected RRAM cell; and
program a neighboring RRAM cell with an error corrected target conductance,
wherein the error corrected target conductance is a function of a neighboring target conductance and the programmed conductance error of the selected RRAM cell;
wherein programming the selected RRAM cell and programming the neighboring RRAM cell program the RRAM array for the analog computation,
wherein the analog computation is a linear transformation, a convolution operation, or a neural network inference algorithm.

18. The non-transitory machine-readable storage medium comprising instructions executable by a processing resource to program the RRAM array for the analog computation of claim 17, wherein the instructions to program the neighboring RRAM cell further comprise instructions to:
program a first neighboring RRAM cell with a first error corrected target conductance, wherein the first error corrected target conductance is a function of a first target conductance and the programmed conductance error of the selected RRAM cell; and
program a second neighboring RRAM cell with a second error corrected target conductance,
wherein the second error corrected target conductance is a function of a second target conductance and the programmed conductance error of the selected RRAM cell, and
wherein the first target conductance and the second target conductance are together reduced by an amount equal to the programmed conductance error of the selected RRAM cell to calculate the first error corrected conductance and the second error corrected conductance.

19. The non-transitory machine-readable storage medium comprising instructions executable by a processing resource to program the RRAM array for the analog computation of claim 17, wherein the instructions to program the neighboring RRAM cell further comprise instructions to:
program a first neighboring RRAM cell with a first error corrected target conductance, wherein the first error corrected target conductance is a function of a first target conductance and the programmed conductance error of the selected RRAM cell; and
program a second neighboring RRAM cell with a second error corrected target conductance, wherein the second error corrected target conductance is a function of a second target conductance and the programmed conductance error of the selected RRAM cell;
program a third neighboring RRAM cell with a third error corrected target conductance, wherein the third error corrected target conductance is a function of a third target conductance and the programmed conductance error of the selected RRAM cell; and
program a fourth neighboring RRAM cell with a fourth error corrected target conductance,
wherein the fourth error corrected target conductance is a function of a fourth target conductance and the programmed conductance error of the selected RRAM cell, and
wherein the wherein the first target conductance, the second target conductance, the third target conductance, and the fourth target conductance are together reduced by an amount equal to the programmed conductance error of the selected RRAM cell.

20. The non-transitory machine-readable storage medium comprising instructions executable by a processing resource to program the RRAM array for the analog computation of claim 18, wherein the instructions to program the neighboring RRAM cell further comprise instructions to:
program a third neighboring RRAM cell with a third error corrected target conductance, wherein the third error corrected target conductance is a function of a third target conductance and a programmed conductance error of the first neighboring RRAM cell; and
program a fourth neighboring RRAM cell with a fourth error corrected target conductance, wherein the fourth error corrected target conductance is a function of a fourth target conductance and a programmed conductance error of the second neighboring RRAM cell.

* * * * *